United States Patent [19]

Yasuhara et al.

[11] Patent Number: 4,987,474
[45] Date of Patent: Jan. 22, 1991

[54] SEMICONDUCTOR DEVICE AND METHOD OF MANUFACTURING THE SAME

[75] Inventors: Toshihiro Yasuhara, Kokubunji; Masachika Masuda, Kodaira; Asao Nishimura, Ushiku; Naozumi Hatada, Yokohama; Sueo Kawai, Ibaragi; Makoto Kitano, Chiyoda; Hideo Miura, Chiyoda; Akihiro Yaguchi, Chiyoda; Gen Murakami, Machida, all of Japan

[73] Assignee: Hitachi, Ltd., Tokyo, Japan

[21] Appl. No.: 536,932

[22] Filed: Jun. 12, 1990

Related U.S. Application Data

[63] Continuation of Ser. No. 245,205, Sep. 16, 1988, abandoned.

[30] Foreign Application Priority Data

| Sep. 18, 1987 | [JP] | Japan | 62-232201 |
| Nov. 20, 1987 | [JP] | Japan | 62-293742 |
| Jan. 22, 1988 | [JP] | Japan | 63-10709 |
| Sep. 19, 1988 | [JP] | Japan | 63-205930 |

[51] Int. Cl.$^5$ ............ H01L 23/48; H01L 23/28; H01L 29/48; H02G 13/08
[52] U.S. Cl. ................. 357/70; 357/72; 357/68; 174/52.4
[58] Field of Search ............... 357/70, 72, 68; 174/52.4

[56] References Cited

U.S. PATENT DOCUMENTS 3,781,457 12/1973 McKerreghan .............. 357/70
4,445,271 5/1984 Grabbe ..................... 357/70

FOREIGN PATENT DOCUMENTS

| 66655 | 4/1982 | Japan | 357/70 |
| 182252 | 10/1983 | Japan | 357/72 |
| 215061 | 12/1983 | Japan | . |
| 119751 | 7/1984 | Japan | 357/72 |
| 107851 | 6/1985 | Japan | 357/70 |
| 123046 | 7/1985 | Japan | 357/72 |
| 218139 | 9/1986 | Japan | . |
| 258458 | 11/1986 | Japan | . |
| 15839 | 1/1987 | Japan | 357/72 |
| 23142 | 1/1987 | Japan | 357/70 |
| 174960 | 7/1987 | Japan | 357/70 |

*Primary Examiner*—Rolf Hille
*Assistant Examiner*—Robert P. Limonek
*Attorney, Agent, or Firm*—Antonelli, Terry, Stout & Kraus

[57] ABSTRACT

In a tabless lead frame wherein a space for laying inner leads is sufficiently secured when a lengthened and enlarged semiconductor pellet is placed or set in a resin-molding package, through holes are provided in leads for the purpose of increasing the occupation area ratio of a resin portion. Furthermore, each of the leads corresponding to the lower surface of the pellet is branched into a plurality of portions in the widthwise direction thereof in order to reduce a stress. Further, in an insulating sheet which is interposed between the leads and the pellet, the dimension of the shorter lateral sides thereof is set smaller than that of the shorter lateral sides of the pellet in order to prevent cracks from occurring at the end part of the insulating sheet.

60 Claims, 26 Drawing Sheets

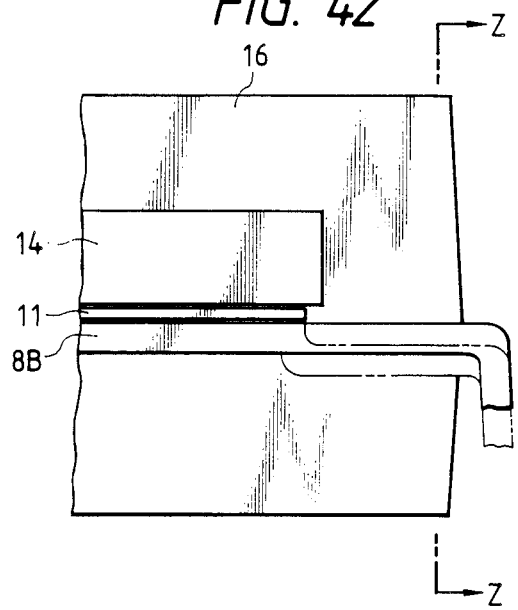
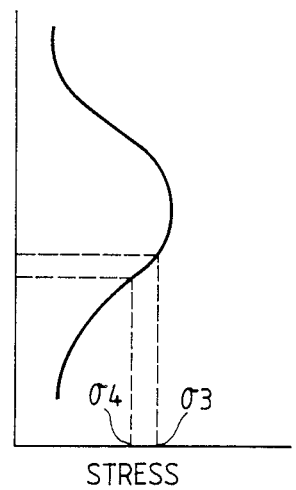
FIG. 42
FIG. 43
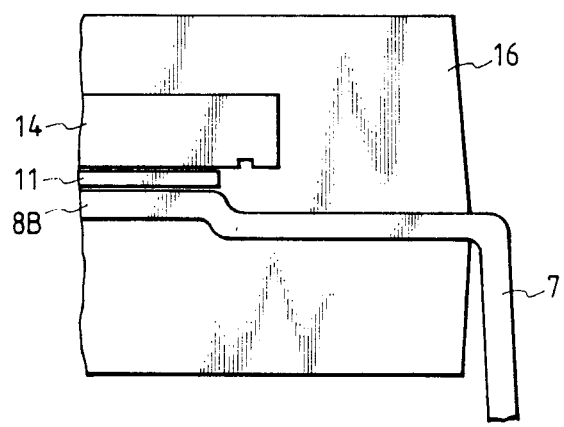
FIG. 44

4,987,474

SEMICONDUCTOR DEVICE AND METHOD OF MANUFACTURING THE SAME

This application is a Continuation of application Serial No. 07/245,205, filed Sept. 16, 1988, now abandoned.

BACKGROUND OF THE INVENTION

The present invention relates to improvements in the technology for producing semiconductor devices, particularly in the technology for laying leads. By way of example, it relates to techniques which are effective when utilized for the manufacture of a semiconductor integrated circuit device comprising a resin-molding package of the dual in-line type (hereinbelow, sometimes called "DILP-IC" or simply "IC").

Heretofore, a resin-molding package of the dual in-line type having a bending width of 300 mils (7.62 mm) has been used in memory type semiconductor integrated circuit devices.

Recently, the memory type semiconductor integrated circuit device has had its semiconductor pellet enlarged lengthwise with rise in the density of integration thereof. In addition, the memory type semiconductor integrated circuit device has the feature that bonding pads in the semiconductor pellet are arranged principally along both the shorter lateral sides of the elongated semiconductor pellet.

This leads to the problem that, when there is an increase in the density of integration in the memory type semiconductor integrated circuit device, it becomes very difficult to keep the bending width of 300 mils in the dual in-line type resin-molding package. The reason is that, in a case where the semiconductor pellet, which is lengthened and enlarged and whose bonding pads are arranged principally along the shorter lateral sides is intended to be received in the dual in-line type resin-molding package whose lateral width is limited, a laying space available for inner leads in the package becomes insufficient.

It is accordingly desired to provide a semiconductor device with a resin-molding package in which the laying space of the inner leads can be held maintained sufficient even in the case of sealing the semiconductor pellet that is lengthened and enlarged and that has the bonding pads arranged principally along the shorter sides of the elongated pellet, such as, of a rectangular shape In order to comply with such a desire, a semiconductor device to be stated below has been proposed:

The semiconductor device comprises a semiconductor pellet, a plurality of leads which are electrically independent of one another and which are provided for constructing external terminals, pieces of bonding wire which are respectively extended across the leads and the semiconductor pellet, and a package which molds the semiconductor pellet, the leads and the bonding wire pieces in a resin, wherein the inner portions (hereinbelow, sometimes called "inner leads") of at least some of the leads are laid under the semiconductor pellet within the package, and an insulating layer is interposed between the semiconductor pellet and the inner leads underlying it.

According to this semiconductor device, the inner leads of at least some of the leads are partly laid under the semiconductor pellet within the resin-molding package, so that the space for laying the inner leads can be maintained as sufficient. Accordingly, even in the case where the semiconductor pellet which is lengthened and enlarged and the bonding pads of which, are, arranged principally along the shorter lateral sides thereof is intended to be received in, i.e. placed or set in for example, the dual in-line type resin-molding package whose lateral width is limited, the inner leads can be satisfactorily laid within the package.

Furthermore, the insulating layer is interposed between the semiconductor pellet and the inner leads laid under this semiconductor pellet, so that the insulation between the semiconductor pellet and the leads is adequately maintained, while the semiconductor pellet can be firmly fixed in the resin-molding package.

Examples of literature exemplifying such semiconductor devices, as discussed above, are found in the official gazettes of Japanese Patent Application Laid-open No. 215061/1983, No. 218139/1986 and No. 258458/1986.

SUMMARY OF THE INVENTION

Regarding the semiconductor device as stated above, the inventors have revealed the problem that, when temperature cycles act on the semiconductor device or are applied thereto, cracks occur locally in the resin-molding package. Such cracks are considered to be ascribable to the differences of the coefficients of thermal expansion associated with the different materials employed between that for the semiconductor pellet, the leads, the resin-molding package, and the insulating layer which is interposed between the semiconductor pellet and the leads.

An object of the present invention is to provide a semiconductor device which can prevent such cracks from occurring, and a method of manufacturing the semiconductor device.

The above and other objects and novel features of the present invention will become apparent from the description of this specification and the accompanying drawings.

Typical aspects of performance of the present invention are summarized as follows:

In a semiconductor device having a semiconductor pellet, a plurality of leads which are electrically independent of one another and which are provided for constructing external terminals, respectively, pieces of bonding wire which are respectively extended across the semiconductor pellet and the inner portions of the corresponding leads, and a package which molds the semiconductor pellet, the inner portions of the leads, and the bonding wire pieces in a resin, wherein at least some of the leads have their inner portions partly laid under the semiconductor pellet within the package, respectively, and an insulating layer is interposed between the semiconductor pellet and the inner portions underlying it; each of at least some of the leads laid under said semiconductor pellet is formed with a through hole for increasing the occupation area ratio of a resin portion at a corresponding a boundary line of each such lead corresponding to a dividing line on the lead defined by the outer edge along the corresponding lateral side of when orthogonally projecting or placing the underside of said semiconductor pellet on said leads, each semiconductor pellet, said through hole being extended along the length of the lead both inwardly and outwardly with respect to said boundary line.

Besides, in the semiconductor device, each of at least some of said leads laid under said semiconductor pellet is branched widthwise into a plurality of parts in, at least, its domain corresponding to the periphery of the lower surface of said semiconductor pellet so as to decrease the stress between the leads.

Further, in the semiconductor device, said insulating layer is made of an insulating sheet which is formed into a rectangular sheet shape, and which has the dimension of the shorter lateral side thereof set to be smaller than that of the shorter lateral side of said semiconductor pellet.

According to the aforementioned first expedient, owing to the through holes which are formed in the inner leads laid under the semiconductor pellet, the effective area of the inner leads is decreased, and that of the resin portion is correspondingly increased, so that the bonding strength between the leads and the resin portion is increased. As a result, resin cracks in the package attributed to stresses, which arise because of temperature changing conditions during the application of temperature cycles, are prevented from occurring.

In addition, according to the aforementioned second expedient in which each of the inner leads is branched widthwise into the plurality of parts, even if the resin portion should peel off the upper surfaces of the leads, the widths of individual fissured clearances can be narrowed, so that stresses at the ends of the leads can be reduced without lowering the strength of the leads and the fixing strength thereof. As a result, resin cracks ascribable, to stresses, which arise during temperature changing conditions under the action of temperature cycles, are prevented from occurring.

According to the aforementioned third expedient in which the shorter lateral side dimension of the insulating sheet interposed between the semiconductor pellet and the leads is set smaller than that of the semiconductor pellet, stress concentration in the resin portion appearing at the end part of the insulating sheet can be reduced significantly even in the extreme situation, so that resin cracks from the end part of the insulating sheet attributed to stresses, which arise during temperature changing conditions under the action of temperature cycles, can be prevented from occurring.

BRIEF DESCRIPTION OF THE DRAWINGS

FIGS. 4–11 illustrate a method of manufacturing a DILP-IC according to embodiment of the present invention, wherein:

FIG. 4 is a plan view, partly omitted, showing a multiple lead frame for use in the embodiment;

FIGS. 5 and 6 are a plan view and a vertical mid-sectional front view, respectively, showing an insulating sheet and a pellet after the step of wire bonding;

FIG. 7 is a plan view showing the circuit layout of the pellet;

FIG. 8 is a plan view showing the pad layout of the pellet;

FIG. 9 is a vertical sectional view showing the step of forming a resin-molding package;

FIG. 10 is a plan view, partly omitted, similarly showing the package forming step; and FIG. 11 is a plan view, partly omitted, showing the multiple lead frame after the formation of the resin-molding package.

FIGS. 42 and 43 are elucidatory views for explaining the functions of the modification in FIG. 41; and FIG. 44 is an enlarged partial vertical sectional view showing another modification of FIGS. 36 and 37.

DESCRIPTION OF THE PREFERRED EMBODIMENTS

[Embodiment 1-9]

Figure 1:
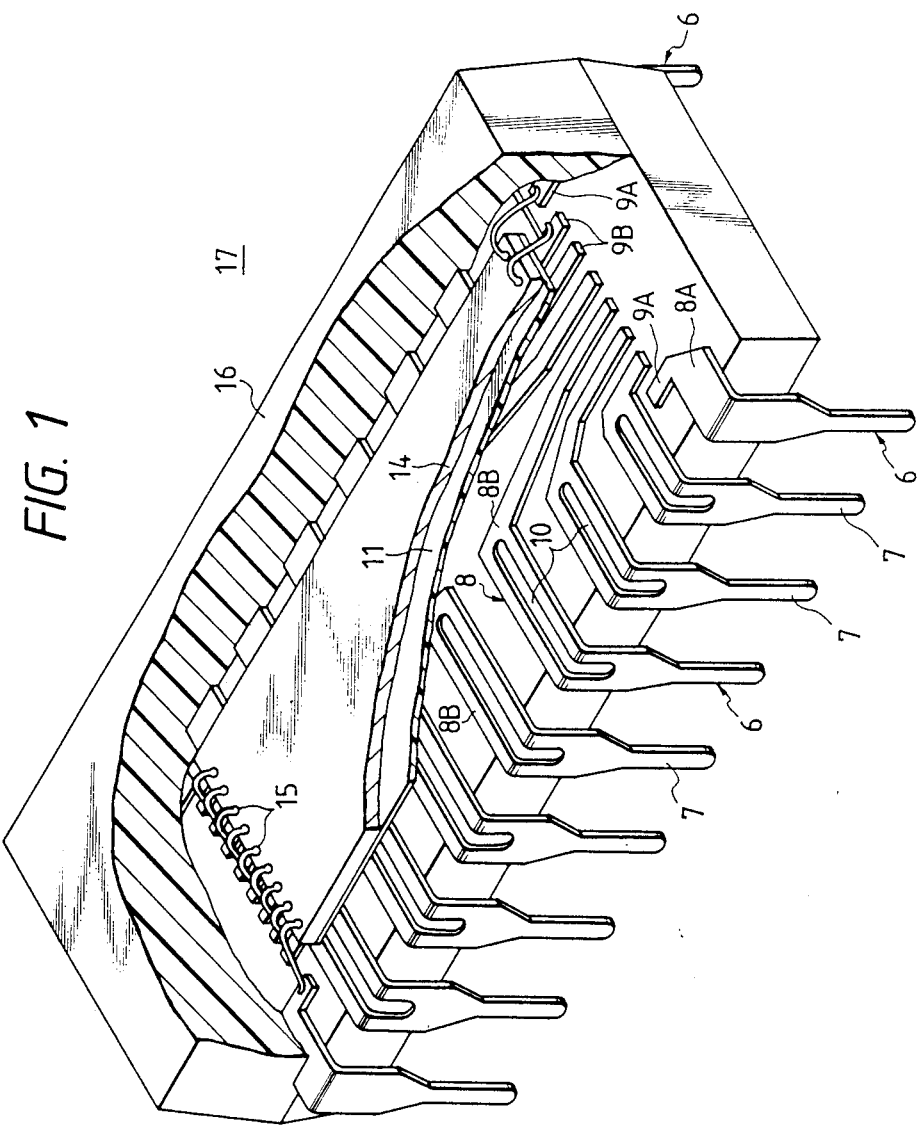
FIG. 1 is a perspective view, partly broken away, showing a DILP-IC which is an embodiment of the present invention.
Figure 2:
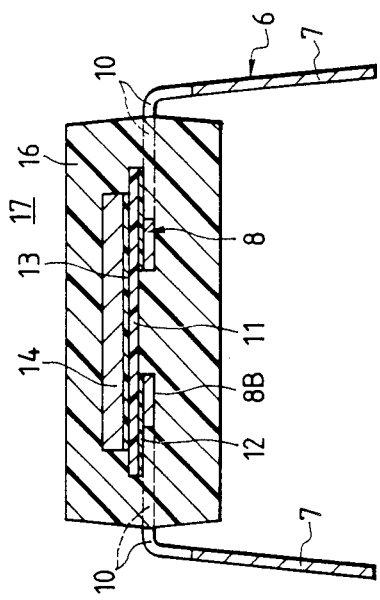
FIG. 2 is a vertical mid-sectional side view of the embodiment.
Figure 3:
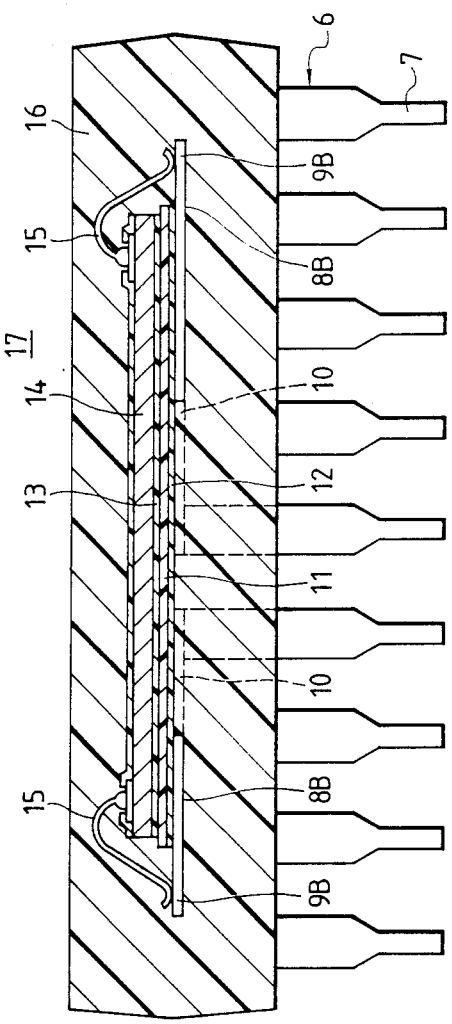
FIG. 3 is a vertical mid-sectional front view of the embodiment.

FIG. 1 is a perspective view, partly broken away, showing a DILP-IC which is an embodiment of the present invention, FIG. 2 is a vertical mid-sectional side view of the embodiment, and FIG. 3 is a vertical mid-sectional front view of the embodiment.

In this embodiment, a semiconductor device according to the present invention is constructed as the DILP-IC 17, and it has a semiconductor pellet 14, a plurality of leads 6 which are electrically independent of one another so as to provide for the construction of external terminals and each of which is formed of an outer portion (hereinbelow, termed "outer lead") 7 led out of a resin-molding package mentioned below, as well as an inner portion (hereinbelow, termed "inner lead") 8 laid inside the package, pieces of bonding wire 15 which are respectively extended from near the ends of corresponding inner leads to the corresponding pad on one of the two short sides of the semiconductor pellet, and the package 16 which molds the semiconductor pellet, the inner leads and the bonding wire pieces in a resin. At least a portion 8B of the inner leads 8 are partly laid, under the semiconductor pellet 14, i.e. below the underside thereof, within the package 16. An insulating sheet 11 is fastened on parts of the inner leads 8B laid under the semiconductor pellet 14, and this semiconductor pellet 14 is bonded on the insulating sheet 11. Further, a through hole 10 is formed in each of the inner leads 8B extending both inwardly and outwardly with respect to the outer edge of the semiconductor pellet 14.

In addition, outside the package 16, the outer leads 7 are crooked and formed into the shape of bat wings, and the bending width of the opposing leads is, i.e. correspondingly disposed leads on opposite sides of the pair of longer sides of the package, set at 300 mils. The DILP-IC thus constructed is produced by a manufacturing method to be stated below.

Now, the method of manufacturing the DILP-IC which is Embodiment 1 of the present invention will be described. The description will clarify the details of the construction of the DILP-IC.

Figure 4:
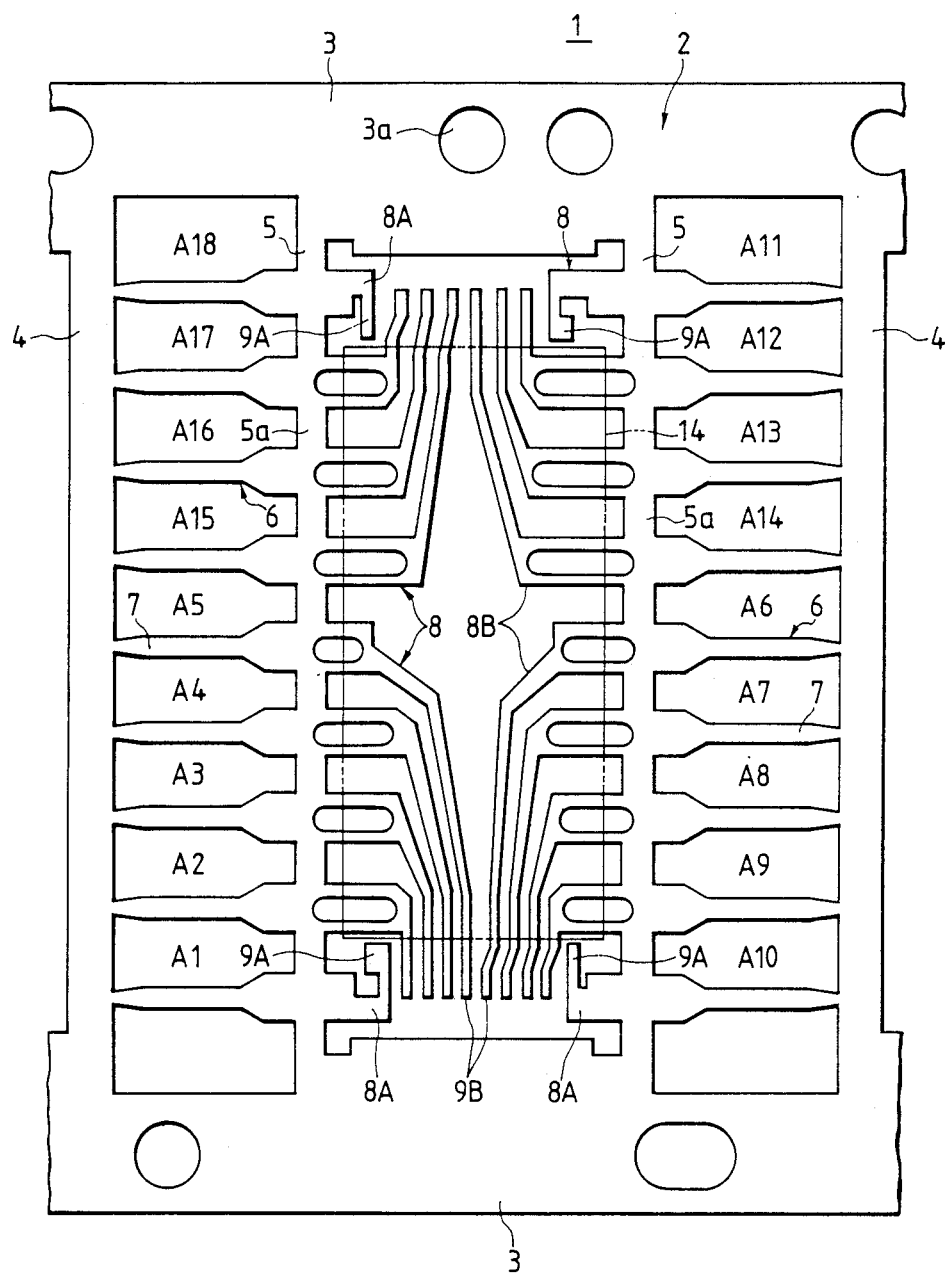

In Embodiment 1, a multiple lead frame 1 shown in FIG. 4 is used for the method of manufacturing the DILP-IC according to the present invention. The multiple lead frame 1 is formed so as to be of a unitary construction by an appropriate technique such as punching press work or etching process, using a thin plate member (having a thickness of, for example, 0.25 mm) which is made of an iron-based material (iron or any alloy thereof) such as 42 Alloy or Kovar, or a copper-based material (copper or any alloy thereof) such as phosphor bronze or oxygen-free copper. In this multiple lead frame 1, a plurality of unit lead frames 2 are juxtaposed in unidirectional alignment.

Each of the unit lead frames 2 has a pair of outer frames 3 provided with positioning holes 3a, and both the outer frames 3, 3 are parallel at a predetermined interval and are respectively extended to be continuous. A pair of section frames 4 are arranged in parallel with each other at the border parts of the adjoining unit lead frames 2, 2, and are unitarily extending across both the outer frames 3, 3. The unit lead frame 2 is constructed in a substantially rectangular framework which is defined by the outer frames and the section frames.

In each of the unit lead frames 2, both the outer frames 3, 3 are unitarily cross connected by a pair of dam members 5 which are respectively arranged in parallel with and in substantially symmetric shapes to each other inside both the section frames 4, 4. Each of both the dam members 5, 5 has a plurality of leads 6 arranged at equal intervals in the lengthwise direction thereof, and the leads 6 are unitarily protruded so as to be parallel to one another in a direction which is orthogonal to the dam member 5. The interspace (or spacings) between the adjacent leads 6, 6 in the dam member 5 constructs, in effect, a dam 5a for obstructing the flow of a resin at the step of forming a package as will be described later.

Since the outer part of each of the leads 6 is projected outside the resin-molding package as will be described later, it constructs an outer lead 7. The respective outer leads 7 have their fore ends (or front ends) connected to the section frame 4, thereby being held by this section frame.

on the other hand, since the inner part of each of the leads 6 is sealed in the resin-molding package as will be described later, it constructs an inner lead 8. In addition, the inner ends of the inner leads 8, being the free ends thereof are respectively arranged so as to form a straight line alignment of such front ends associated with inner leads passing through predetermined positions on both shorter lateral sides in the vacancy (or unused space) associated with the unit lead frame 2, and these ends are positionally opposing the bonding pads of a semiconductor pellet to be described later, thereby to construct, in effect, respective wire bonding portions 9.

In Embodiment 1, the inner leads 8 can be broadly classified into two sorts. One of the sorts is a group of inner leads (hereinbelow, termed "peripheral inner leads 8A") which are laid by utilizing the space of a peripheral part within the vacancy of the unit lead frame 2, likewise to inner leads in a conventional DILP-IC, while the other is a group of inner leads (hereinbelow, termed "central inner leads 8B") which are laid by utilizing the space of a central part within the vacancy of the unit lead frame 2, quite unlike the inner leads in the conventional DILP-IC. The peripheral inner lead 8A has the wire bonding portion 9A thereof extended from the peripheral side toward the central part of the unit lead frame, whereas the central inner lead 8B has the wire bonding portion 9B thereof extended from the central side toward the peripheral part of the unit lead frame. However, both the wire bonding portions 9A and 9B of the respective inner leads 8A and 8B in the peripheral part and the central part are aligned on the corresponding ones of straight lines at predetermined positions. The central inner leads 8B are laid under the semiconductor pellet to be described later.

Thus, in the unit lead frame 2 according to Embodiment 1, the central inner leads 8B are laid in the central region within the vacancy of the unit lead frame 2, so that the whole vacancy can be used very effectively. As a result, even in a case where the vacancy of the unit lead frame 2 is of an elongated shape, all the inner leads 8 can be laid properly and safely without touching one another.

Further, in Embodiment 1, each of the central inner leads 8B is provided with a through hole 10. The through hole 10 serves to enlarge the occupation area ratio of a resin portion at the boundary line of the inner lead 8B opposing to the outer edge of the semiconductor pellet to be described later, and the details of the function of this through hole will be explained later. The through hole 10 is formed in the shape of an ellipse, and is dimensioned so as to spread or extend both inwardly and outwardly with respect to the boundary line. That is, the through hole 10 is spread from a position just under the semiconductor pellet to the dam member 5.

Figure 5:
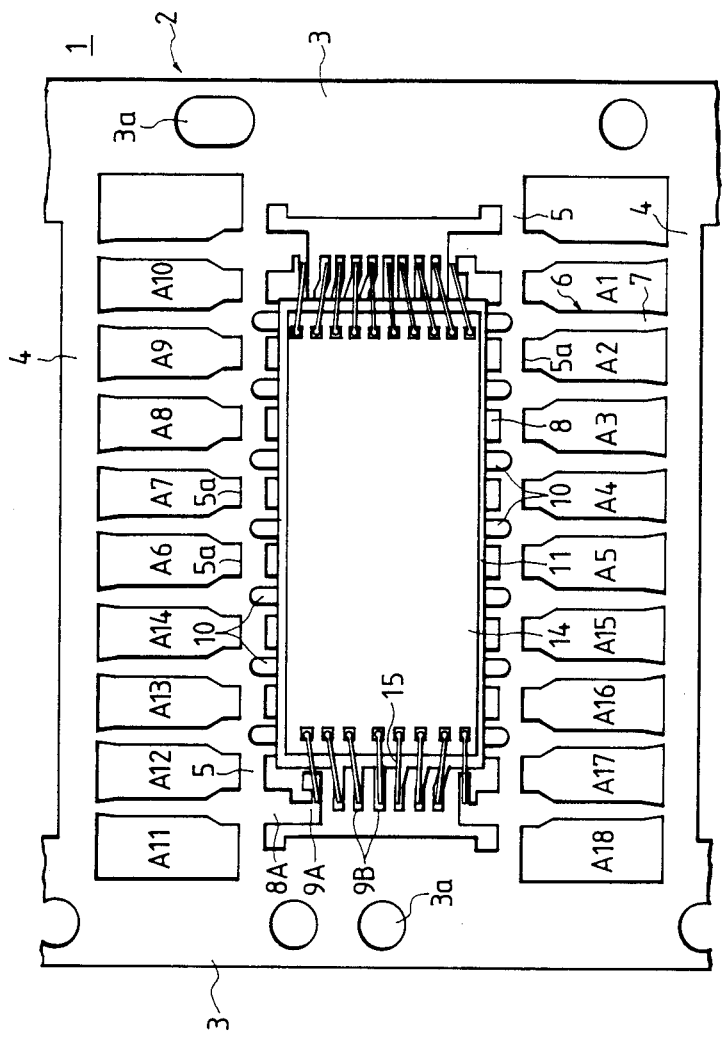
Figure 6:
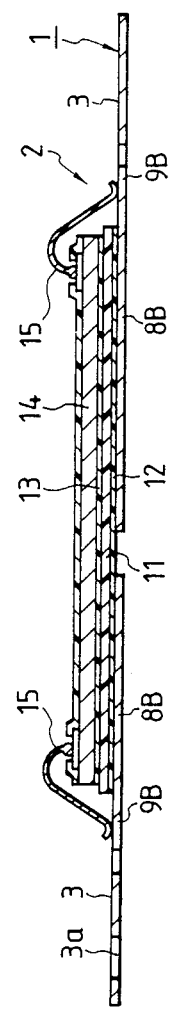

The lead frame 1 thus constructed is subjected to the operation of bonding an insulating sheet, the operation of bonding the pellet, and the operation of bonding wire in succession for every unit lead frame 2. The bonding operations are successively performed for each unit lead frame 2 in such, a way that the lead frame 1 is fed serially in accordance with a pitch. Then, an intermediate product shown in FIGS. 5 and 6 is manufactured by these bonding operations.

First, the insulating sheet 11 is bonded onto the central inner leads 8B in the unit lead frame 2 through a bonding layer 12 made of an adhesive, by the insulating sheet-bonding operation. On this occasion, the insulating sheet 11 is arranged so that its outer edge may intersect orthogonally to substantially the central parts of the through holes 10 in the longitudinal directions thereof, the through holes being respectively formed in the central inner leads 8B.

In Embodiment 1, the insulating sheet 11 is formed using a material of good electrical insulation such as polyimide type resin film. This insulating sheet 11 is formed in the shape of a rectangle which is somewhat larger in area than the semiconductor pellet to be described below, as viewed in plan. From the correlation between the upkeep of the electrical insulation and a mechanical strength, the insulating sheet 11 should desirably have a thickness of about 125 $\mu$m.

As the adhesive for forming the bonding layer 12, there is used a thermoplastic one such as polyether amidoimide.

Subsequently, the semiconductor pellet (hereinbelow, simply termed "pellet") 14 in which a required integrated circuit has been fabricated by a preceding process is bonded onto the insulating sheet 11 in each unit lead frame 2 through a bonding layer 13 made of an adhesive. On this occasion, the pellet 14 is disposed so as to be substantially concentric with the insulating sheet 11.

As the adhesive for forming the bonding layer 13 which secures the pellet to the insulating sheet, there is used a multilayer adhesive in which a nonconductive paste material, for example, silicone rubber, epoxy rubber, epoxy type resin or polyimide type resin is stacked on a thermosetting polyimide type resin adhesive, for example, polypyromellitic imide or polyketone imide.

Figure 7:
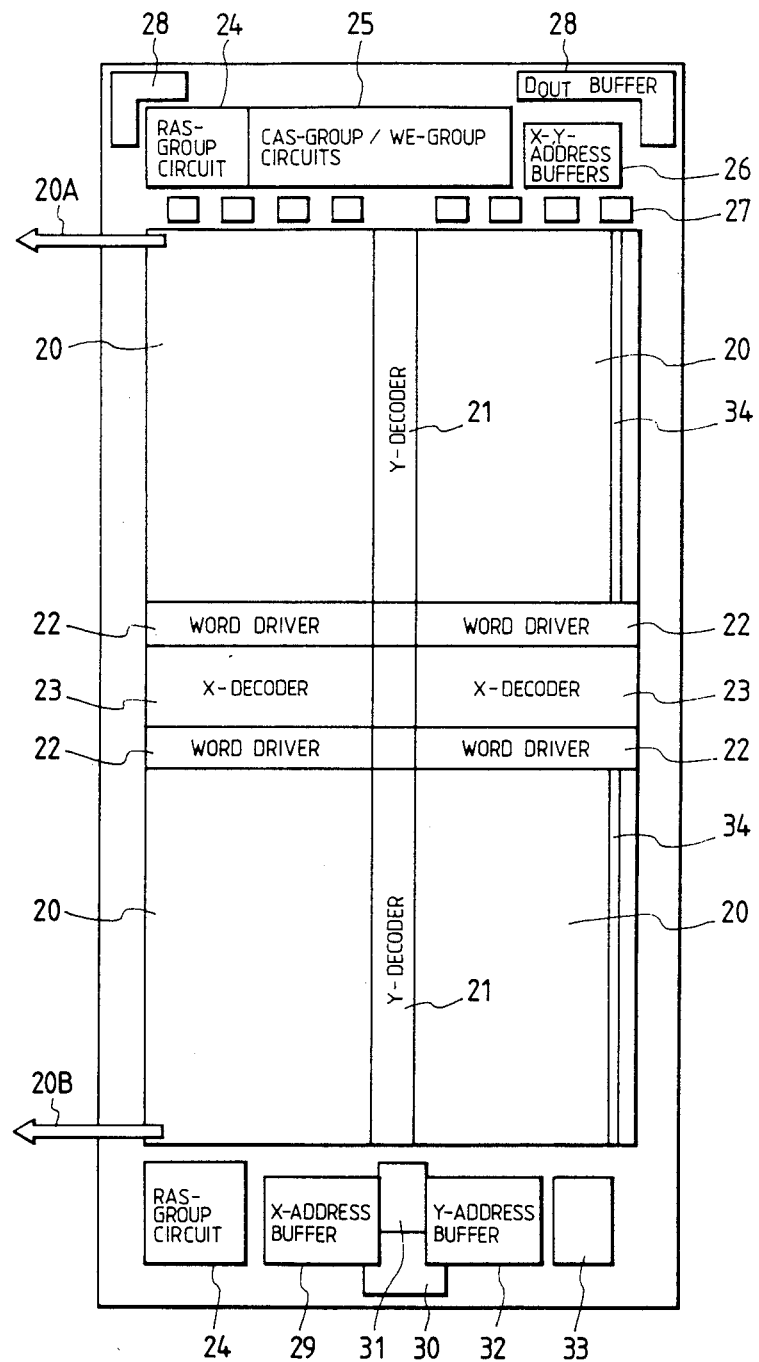

Here, in Embodiment 1, the pellet 14 is fabricated as a semiconductor integrated circuit chip of the 4-megabit random access memory (hereinbelow, sometimes called "4MDRAM") type, the circuit arrangement of which is laid out as shown in FIG. 7.

Memory mats 20 are provided in a central area of the pellet 14. In the central part of the pellet 14 in the X direction thereof, Y-decoders 21 are provided in parallel with a Y-axis so as to extend along the memory mats 20, while in the central part of the pellet 14 in the Y direction thereof, word drivers 22 and X-decoders 23 are provided in parallel with an X-axis so as to extend along the memory mats 20. In addition, at one end of the pellet 14 in the longer lateral direction wherein the ends are defined by the shorter sides of the pellet, thereof, there are provided a RAS-group circuit 24, a CAS-group/WE-group circuit 25, and an X- and Y-address buffer 26, inside which main amplifiers 27 are provided. Also, $D_{out}$ (data output) buffers 28 are provided at the corners of the same shorter side. Provided at the other end, i.e. near the other shorter side of the pellet, are a RAS-group circuit 24, an X-address buffer 29, an X-generator 30, an X- and Y-generator 31, a Y-address buffer 32, and an SHR/PC-generator 33. Besides, at the right side end of the pellet 14 in the shorter lateral direction thereof, sense amplifiers/common inputs and outputs/common sources 34 are provided, and at the left side end, the upper terminals 20A of the memory mats 20 are provided at the upper end thereof, while the lower terminals 20B of the memory mats 20 are provided at the lower end thereof.

Figure 8:
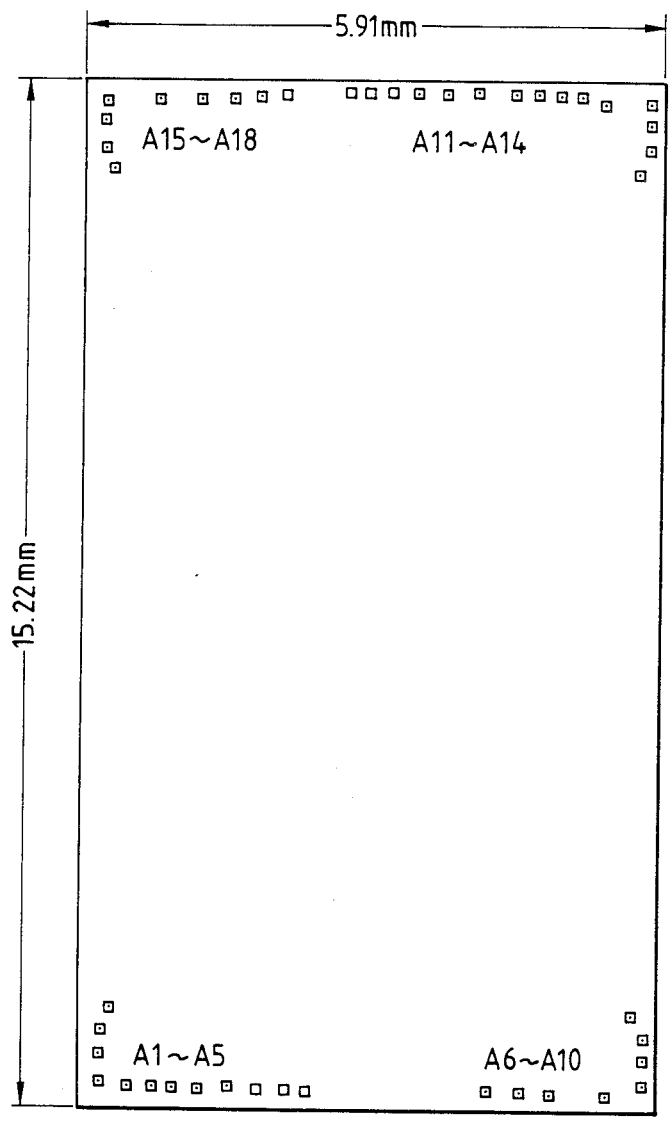

As shown in FIG. 8, the electrodes (pads) $A_1$-$A_{18}$ and $P_1$-$P_3$ of the various circuits provided in the pellet 14 are disposed at both ends of the pellet in the lengthwise direction thereof, namely, in both shorter lateral parts of the pellet. The electrodes (pads) $A_1$-$A_{18}$ are bonding pads, while the electrodes (pads) $P_1$-$P_3$ are probing pads which are used for testing electrical characteristics.

Subsequently, at the wire bonding step, each one of the pieces of wire 15 has one of its ends bonded to one of the electrode pads A-$A_{18}$ of the pellet 14 which is bonded on the insulating sheet 11 and other end bonded to the corresponding one of the wire bonding portions 9 of the inner leads 8 in the unit lead frame 2 so as to bridgingly extend across them.

The material of the bonding wire 15 is, for example, a gold (Au) wire having a diameter of 30 μm.

In addition, an ultrasonic thermocompression type wire bonding apparatus (not shown) is used for the wire bonding step. In the wire bonding apparatus, a capillary is employed as a bonding tool. The first bonding part of the wire piece on the pellet side is formed in such a way that a ball produced by melting the fore end part of the wire material by means of a discharge electrode is pressed against the electrode pad of the pellet by the capillary. On the other hand, the second bonding part of the wire piece on the inner lead side is formed in such a way that the intermediate part of the wire material is pressed against the bonding part of the inner lead by the capillary while being supplied with ultrasonic energy. Incidentally, a silver plating film (not shown) is deposited on the region of the bonding portion 9 in the front surface of the inner lead 8.

Thus, the integrated circuit fabricated in the pellet 14 is electrically led out through the electrode pads, wire pieces 15, inner leads 8 and outer leads 7.

Figure 9:
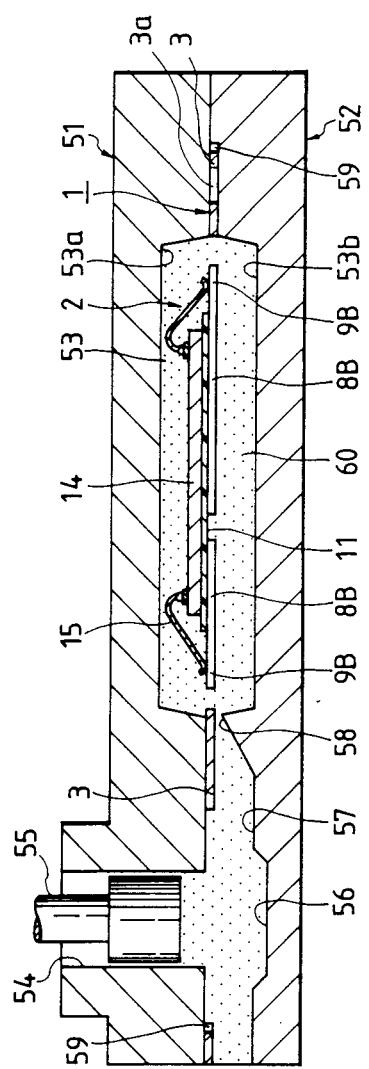
Figure 10:
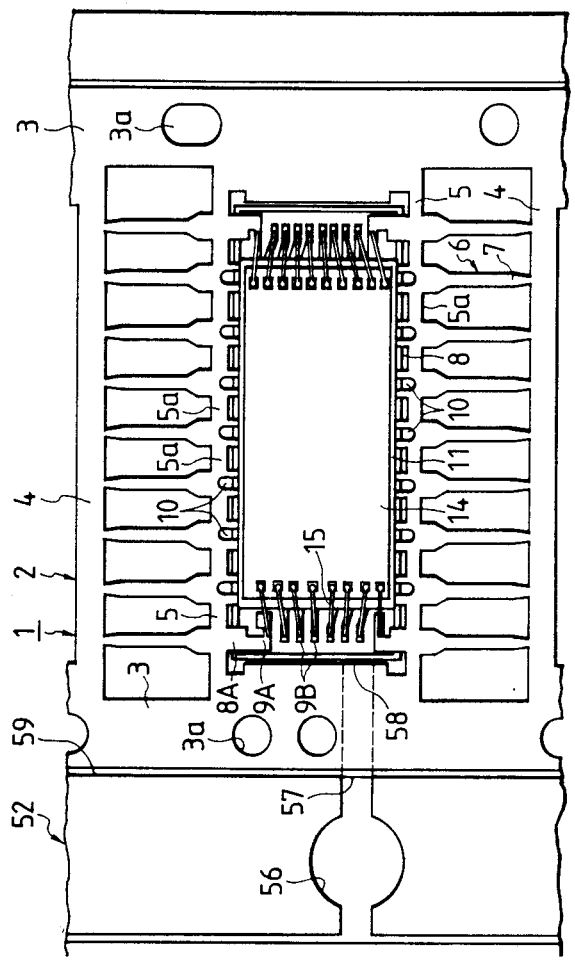

The multiple lead frame with the pellets and the groups of the wire pieces bonded thereto in this way is formed with the packages, each of which molds the corresponding one of the unit lead frames in the resin, simultaneously for the unit lead frames by the use of a transfer molding apparatus as illustrated in FIGS. 9 and 10.

The transfer molding apparatus 50 shown in FIGS. 9 and 10 is furnished with a pair of molds; an upper mold 51 and a lower mold 52 which are clamped to each other by a cylinder assembly or the like (not shown). The mating surfaces of the upper mold 51 and the lower mold 52 are indentedly provided with upper-mold cavity recesses 53a and lower-mold cavity recesses 53b in a plurality of sets, respectively, so that the cavity recess 53a and cavity recess 53b of each set may cooperate to define a cavity 53. Besides, the cavity 53 is formed so as to be capable of receiving the insulating sheet 11.

The mating surface of the upper mold 51 is formed with a pot 54, in which a plunger 55 adapted to be advanced and retreated by a cylinder device (not shown) is inserted so as to be capable of feeding the resin as a molding material (an epoxy type resin to which a reinforcing material such as silica is added, and such a resin material shall hereinbelow be simply termed "resin"). On the other hand, the mating surface of the lower mold 52 is indentedly provided with a caldera 56 at a position confronting the pot 54, and with a plurality of runners 57 radiately arranged so as to connect to the pot 54, respectively. The end of each of the runners 57 remote from the pot 54 is connected to the corresponding lower-mold cavity recess 53b, and a gate 58 is formed at the connection part so that it can pour the resin into the cavity 53. In addition, the mating surface of the lower mold 52 is indentedly provided with a clearance recess 59 in the shape of a rectangle which is somewhat larger than the external shape of the multiple lead frame 1 and at a fixed depth which is nearly equal to the thickness of this multiple lead frame, so as to be capable of clearing up the thickness of the lead frame.

In the case where the resin-molding packages are formed using the multiple lead frame 1 of the foregoing construction and by the transfer molding apparatus, each of the cavities 53 defined by the upper mold 51 and the lower mold 52 is held in correspondence with the space between the pair of dam members 5, 5 in the corresponding unit lead frame 2.

In the transfer molding operation, the multiple lead frame 1 constructed as stated before is set in the clearance recess 59 formed in the lower mold 52, in such an arrangement that the insulating sheet 11 and pellet 14 in each of the unit lead frames 2 are received in the corresponding cavity 53. The structures of the mold assembly and the lead frame are set so that, on this occasion, all the through holes 10 respectively provided in the central inner leads 8B may protrude out of the opening edge of the cavity recess 53b as illustrated in FIG. 10.

Subsequently, the upper mold 51 and the lower mold 52 are clamped together, and the resin 60 is fed under pressure from the pot 54 into the cavities 53 through the runners 57 as well as the gates 58 by the plunger 55. The resin 60 injected from the gates 58 into the cavities 53 is diffused into each of the entire cavities 53.

On this occasion, since the through holes 10 are provided in the respective central inner leads 8B and the resin 60 can readily flow through these through holes 10, the resin 60 is effectively diffused into the upper and lower spaces of the cavity 53 so as to reliably fill up the whole cavity 53. Also, the resin 60 is packed into the through holes 10. In facet, some of the resin 60 which is packed in the through holes 10 also ends up at the parts of the through holes 10 which are extended out of the cavity 53.

After the injection, the resin is thermally set to form the resin-molding packages 16. Then, the upper mold 51 and the lower mold 52 are opened, and the packages 16 are released by ejector pins (not shown).

Figure 11:
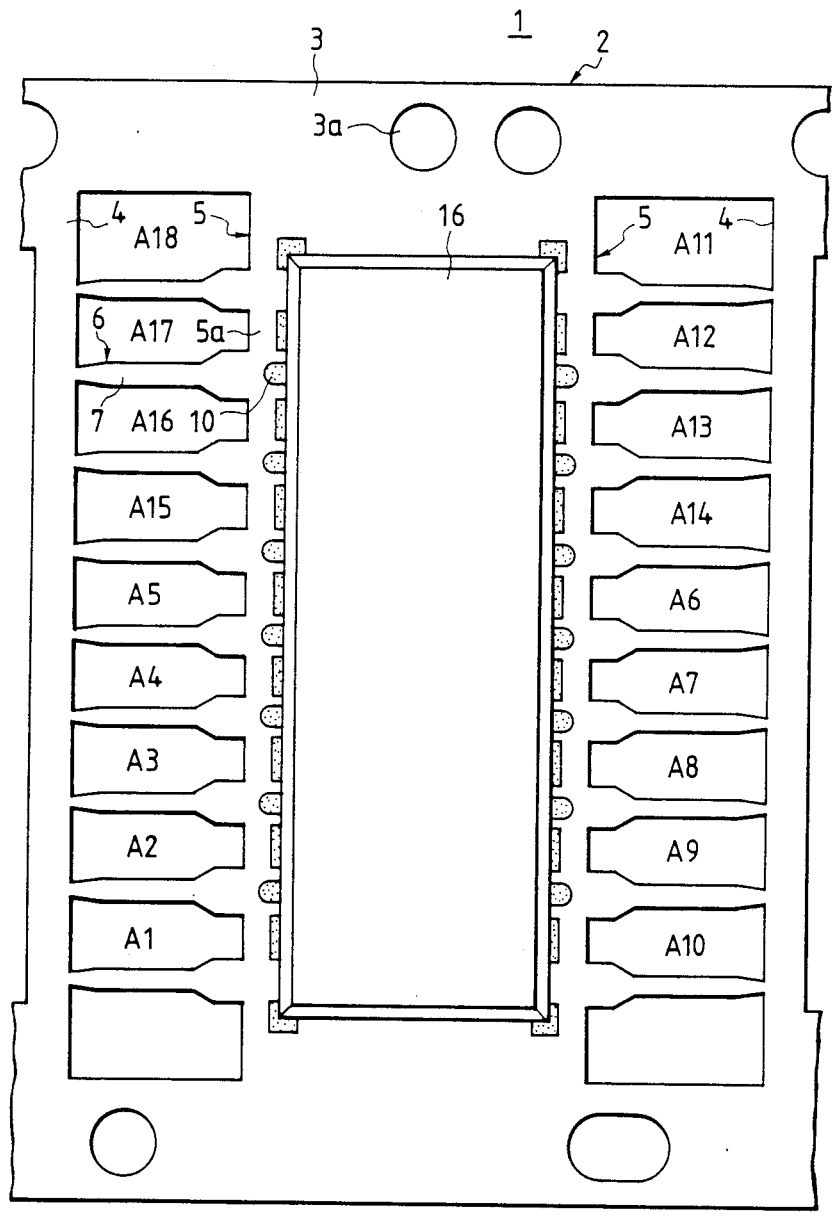

Thus, the multiple lead frame 1 formed with the packages 16 as illustrated in FIG. 11 is detached from the transfer molding apparatus 50. Inside each of the packages 16 formed of the resin in this way, the insulating sheet 11, pellet 14, inner leads 8 and bonding wire pieces 15 are sealed in the resin.

Thereafter, the resin-molding package 16 is subjected to the removal of burrs formed between the dams 5a and the outer leads 7 on both sides thereof and burrs formed in the exposed spaces of the through holes 10.

Subsequently, the multiple lead frame has a solder film deposited over the whole exposed metal surfaces by suitable means such as an electrolytic plating apparatus or a solder dipping apparatus, not shown.

Besides, at a lead cutting and forming step, the multiple lead frame has the outer frames 3 and the dams 5a cut away successively in the individual unit lead frames by a lead cutting apparatus (not shown), whereupon the outer leads 7 are made crooked into the shape of bat wings (or bent downwardly) by a lead forming apparatus (not shown). On this occasion, the crooking, i.e., bending, is properly performed without giving rise to excessive strains because the crook portions 7a of the outer leads 7 are provided with the through holes 10.

The DILP-IC 17 shown in FIGS. 1-3 has been produced by the manufacturing method as stated above.

Next, the functions of this embodiment will be described.

The articles of the DILP-IC produced by the manufacturing method are subjected to a sampling inspection before shipment. Environmental tests including a temperature cycle test and a thermal shock test are carried out during the sampling inspection. In addition, when the DILP-IC is installed on a printed-wiring circuit board or the like, it is heated by a solder dipping process or a reflow solder process, so that the DILP-IC is placed under a changing environmental situation in which temperature cycles act thereon. Further, even during the operation of the DILP-IC after the installation thereof, this DILP-IC is heated by self-heating and under the influences of other electronic devices, so that the DILP-IC is sometimes placed under a situation in which temperature cycles act thereon.

Meanwhile, it has been revealed by the inventors that, when temperature cycles act on a DILP-IC in such environmental tests or installing operations, in a semiconductor device comprising a resin-molding package wherein inner leads are laid under a pellet and wherein an insulating layer is interposed between the central inner leads of the inner leads and the pellet, there is involved the problem of cracks occurring in the resin-molding package.

More specifically, in the temperature cycles, the cracks which occur or result are caused locally at the parts of a resin which is in contact with the inner leads within the body of the resin-molding package by stresses which are ascribable to the difference between the coefficient of thermal expansion of a metal material used for the fabrication of a lead frame ($\alpha=0.4\times10^{-5}/°C.$ as to 42 Ni—Fe, $\alpha=1.7\times10^{-5}/°C.$ as to Cu) and the coefficient of thermal expansion of a resin material used as the molding resin ($\alpha=1.0\times10^{-5}/°C.$ as to the resin).

In contrast, in Embodiment 1, the through holes 10 are provided in the central inner leads 8B so as to extend or spread from the positions just under the pellet 14 to the exterior of the package 16, so that the cracks ascribable to the stresses typically arising as a result of the changing environmental conditions effected by the temperature cycles are thereby prevented from occurring.

More specifically, the central inner lead 8B formed with the through hole 10 is smaller in the area ratio thereof to a molding resin portion than the central inner lead in the prior art not formed with the through hole, so that the bonding strength between the central inner lead 8B and the molding resin portion becomes higher. As a result, even when the stress arising under the changing conditions effected by the temperature cycles has acted between the central inner lead 8B and the resin portion bonded thereto, the bonding strength between the central inner lead 8B and the resin portion can endure the action of the stress, so that no crack occurs in the molding resin portion.

Figure 12:
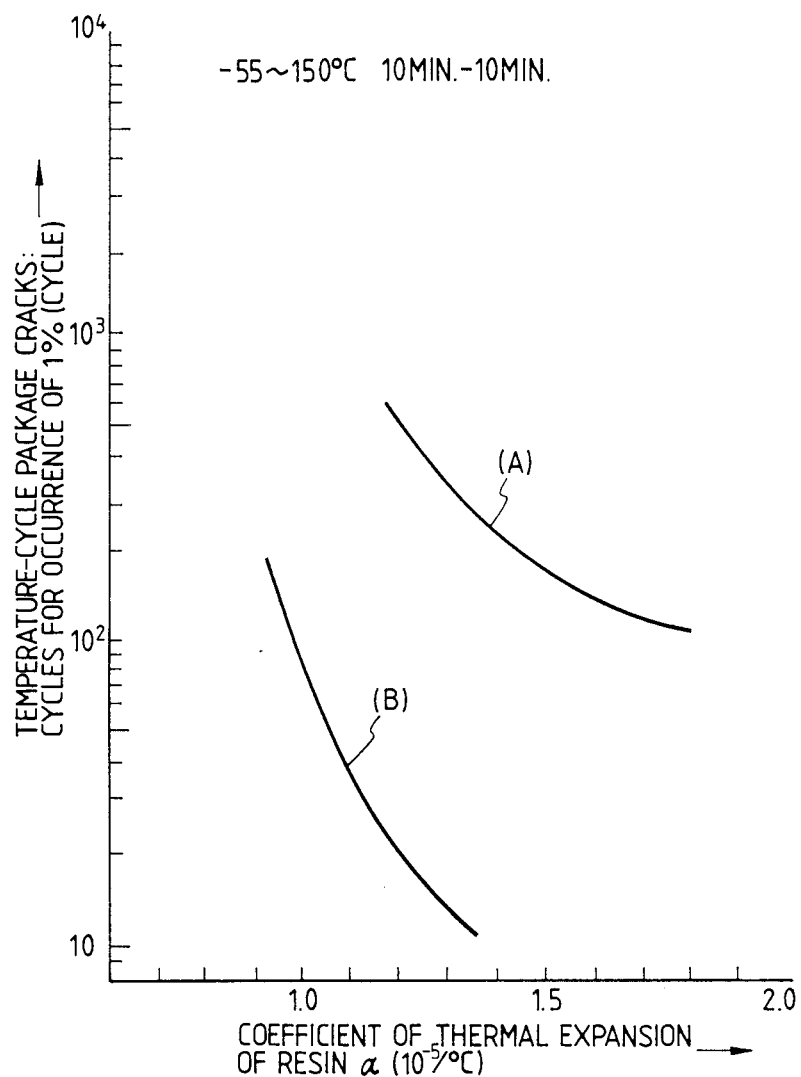
FIGS. 12, 13 and 14 are graphs for explaining the functions of the embodiment in FIGS. 1–11.

Here, FIG. 12 is a graph showing the results of an experiment which was conducted on the relationship between the coefficient of thermal expansion $\alpha$ of the resin and the number of cycles in the case where the cracks occurred 1% under the temperature cycle situation.

In FIG. 12, (A) represents a characteristic curve indicating the case of Embodiment 1 where the central inner leads are formed with the rectangular through holes, and (B) a characteristic curve indicating the case of the prior-art example where the central inner leads are not formed with any through holes.

Figure 13:
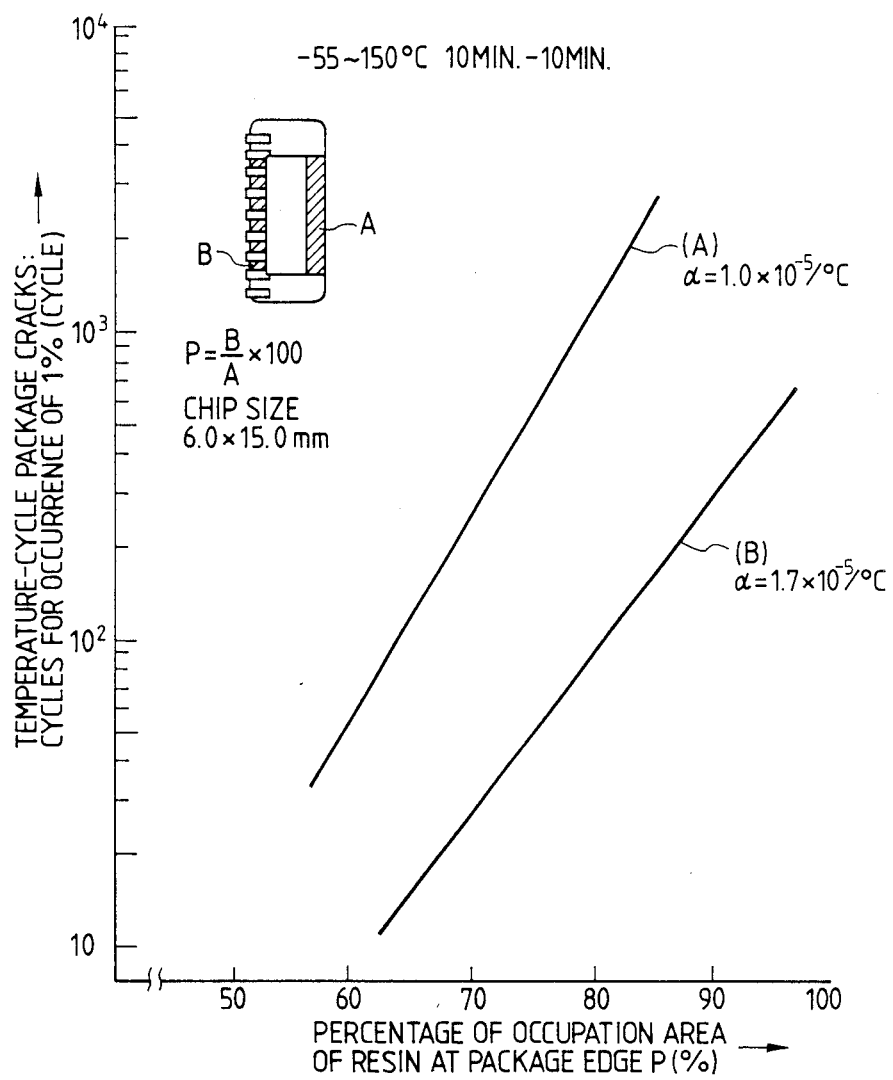

FIG. 13 is a graph showing the results of an experiment which was conducted on the relationship between the percentage of the occupation area of the resin at a package edge and the number of temperature cycles.

Figure 14:
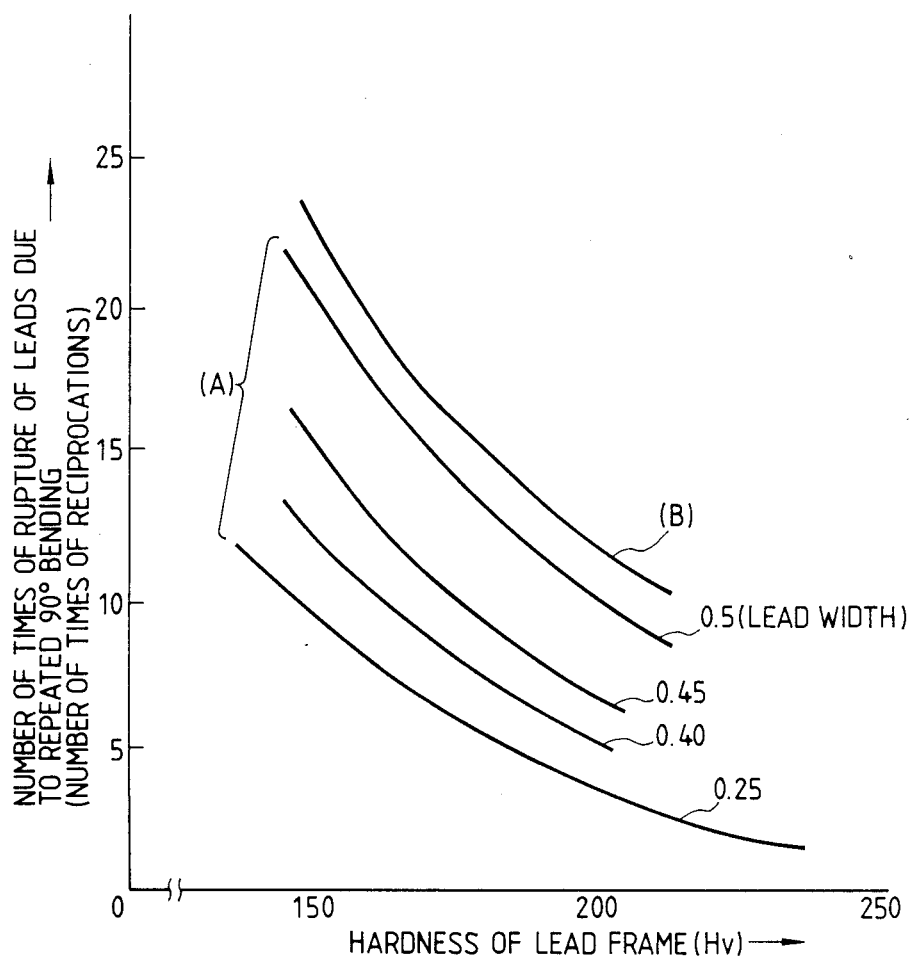

In FIG. 13, (A) represents a characteristic curve in the case where the coefficient of thermal expansion $\alpha$ of the resin is $1.0\times10^{-5}/°C.$, and (B) a characteristic curve in the case where it is $1.7\times10^{-5}/°C.$ FIG. 14 is a graph showing the results of an experiment which was conducted on the relationship between the hardness of the lead frame in Embodiment 1 and the number of times of the rupture of leads due to repeated 90-degree bending.

In FIG. 14, (A) represents characteristic curves indicating the cases of Embodiment 1 where the inner leads are provided with the rectangular through holes 10, and numerals 0.5, 0.45, 0.4 and 0.25 denote the lead widths (in mm) of those parts of the inner leads in which the rectangular through holes are formed. (B) represents a characteristic curve indicating the case of the prior-art example where the inner leads are not provided with the through holes.

Also from the experimental results illustrated in these graphs, it will be understood that the effect stated above is attained in accordance with Embodiment 1.

According to the embodiment, the following effects are brought forth:

(1) At least some of inner leads are laid under a semiconductor pellet within a resin-molding package, whereby a laying space for the inner leads can be sufficiently secured. Therefore, the inner leads can be properly laid within the resin-molding package even in a case where a semiconductor pellet which is lengthened and enlarged and the bonding pads of which are arranged principally along the shorter lateral sides thereof is to be received, i.e. placed or set in a resin-molding package of the dual in-line type as in the case of a memory type semiconductor integrated circuit device which is integrated at a high density.

(2) Owing to the effect (1), even in a DILP-IC in which a pellet at a high density of integration, such as 4MDRAM, is packaged, the standard of 300 mils as to bending intervals can still be maintained, so that a desired versatility or compatibility can be kept in a memory type semiconductor integrated circuit device.

(3) At least some of inner leads are laid under a semiconductor pellet within a resin-molding package, whereby a space outside the semiconductor pellet can be set relatively large. Therefore, having the versatility in the design of the laying of the inner leads can be relatively enhanced, and alteration in the arrangement of bonding pads in the semiconductor pellet can be coped with more easily.

(4) A lead frame in which at least some of the inner leads are laid in the vacancy of the central part thereof is prepared such that an insulating sheet is fastened onto the central inner leads in the lead frame, and a semiconductor pellet is bonded onto the insulating sheet, whereby the semiconductor pellet can be firmly fixed within a resin-molding package, and the electrical insulation between the semiconductor pellet and the inner leads can be kept good. Therefore, even in the case of the item (1), the performance of the semiconductor device comprising the resin-molding package can be prevented from degrading.

(5) Central inner leads are provided with through holes for increasing the area ratio of molding resin portions, whereby the bonding strength between the inner leads and the molding resin portions can be raised. It is therefore possible to prevent the occurrence of the cracks of a molding resin attributed to stresses which arise under a situation where temperature cycles act.

(6) Through holes are extended to the exterior of a package, whereby bending loads at the step of crooking or bending action and forming outer leads can be relieved. Therefore, clearances can be prevented from appearing between leads and the open edge of the package at the crooking and forming step.

Although, in the above, the invention made by the inventors has been concretely described in conjunction with Embodiment 1, it is needless to say that the present invention is not restricted to the foregoing embodiment, but that it can be variously altered within a scope not departing from the purport thereof.

By way of example, through holes to be formed in central inner leads can be properly modified as illustrated in FIGS. 15–22.

Figure 15:
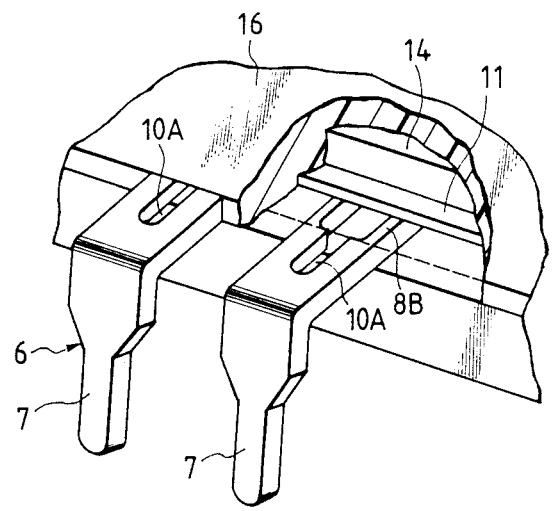
FIGS. 15, 16, 17, 18, 19, 20, and FIGS. 21 and 22 are enlarged partial perspective views showing modifications of the foregoing embodiment, respectively.

Each of through holes 10A shown in FIG. 15 is formed so as to have a large width inside the resin-molding package 16 and a relatively small width outside the package 16.

According to the through hole 10A, the occupation area ratio of the molding resin portion can be sufficiently secured inside the package, while the extent of the appearance of burrs can be suppressed to the minimum limit outside the package. Moreover, since a decrease in the cross-sectional area of the outer lead 7 is suppressed, lowering in the strength of the outer lead can be avoided.

Besides, in this example, the outer relatively small-width part of the through hole 10A is not extended to the crook part of the outer lead 7, i.e. the portion thereof wherein bending is effected. Accordingly, even in a case where burrs have developed at the small-width part, the operation of crooking or bending and forming the outer lead 7 is not adversely affected. In addition, since the extent of the appearance of the burrs is very slight, it is possible to omit a trimming operation.

Figure 16:
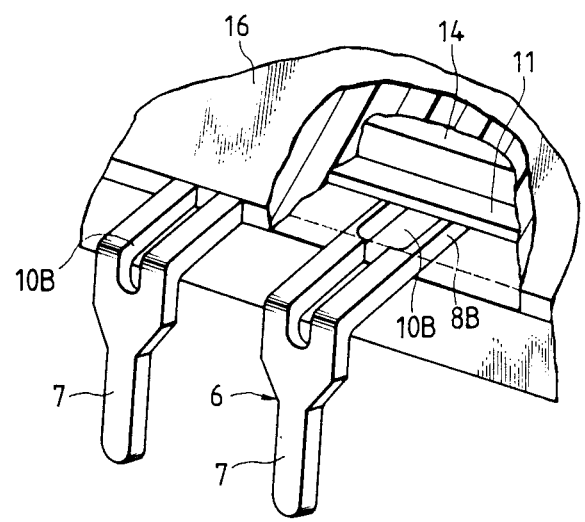

Each of through holes 10B shown in FIG. 16 is such that its part which is exposed outside the package 16 is formed into a small width, and that the small-width part is extended to the crook or bending part of the outer lead 7.

According to this example, the effect of reducing the bending load at the step of crooking and forming the outer lead 7 can be harmonized with the strength of the outer lead after the crooking, through the setting of the dimensions of the small-width part.

Figure 17:
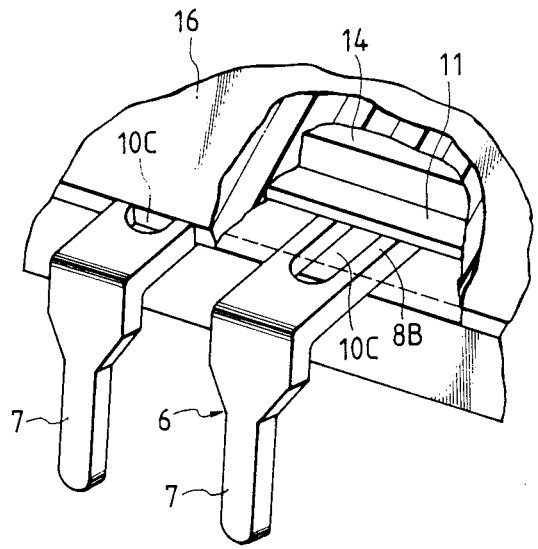

Each of through holes 10C shown in FIG. 17 has its outer end part formed into a semicircular shape, and it is so set that only the semicircular part is exposed outside the package 16.

According to this example, the occupation area ratio of the molding resin can be sufficiently raised inside the package 16.

Figure 18:
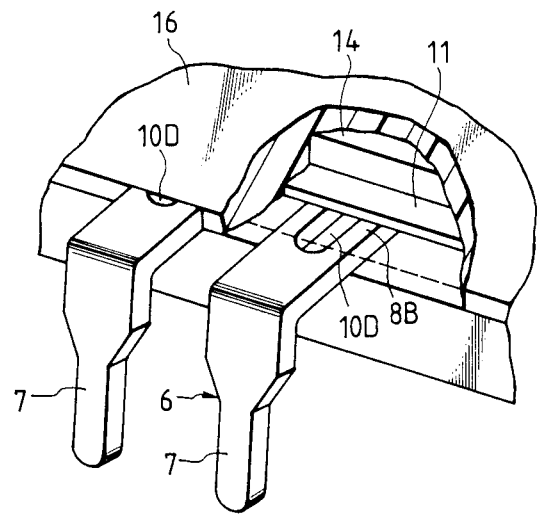

Each of through holes 10D shown in FIG. 18 has its outer end part formed into an oblong shape, both the corners of which are somewhat chamfered, and it is so set that the oblong part is exposed in a minute dimension outside the package 16.

According to this example, the extent of the appearance of burrs can be suppressed more than in the case shown in FIG. 17.

Figure 19:
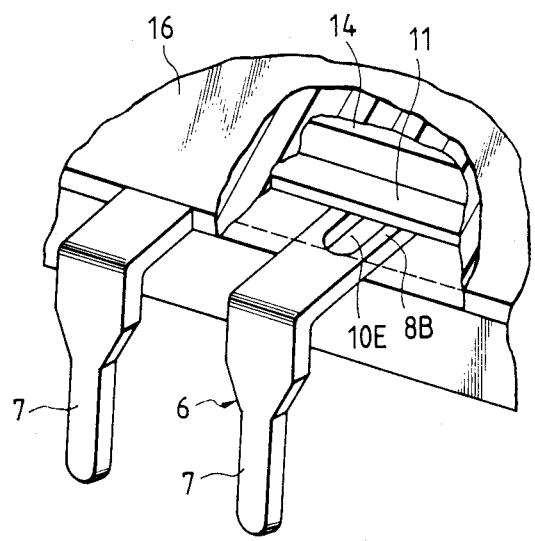

Each of through holes 10E shown in FIG. 19 is so constructed that its outer end part lies on the boundary line between the interior and exterior of the package 16.

According to this example, the occupation area ratio of the molding resin can be sufficiently raised inside the package 16, while the exposure of the through hole 10E to the exterior can be avoided. Accordingly, the appearance of burrs is evitable, and lowering in the strength of the outer lead 7 is evitable.

Figure 20:
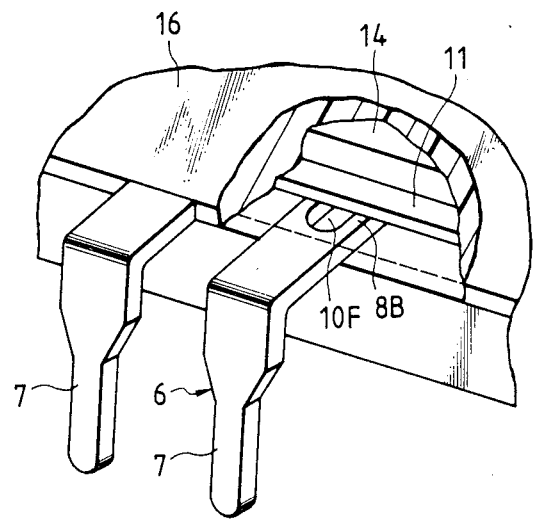

Each of through holes 10F shown in FIG. 20 is so constructed that its outer end part lies inside the package 16 and near the boundary line thereof.

According to this example, even in such a case where an error has developed in the mating precision of the molds in the operation of forming the package 16 as stated before, a situation can be avoided where the end part of the through hole 10F is exposed outside the package 16.

Figure 21:
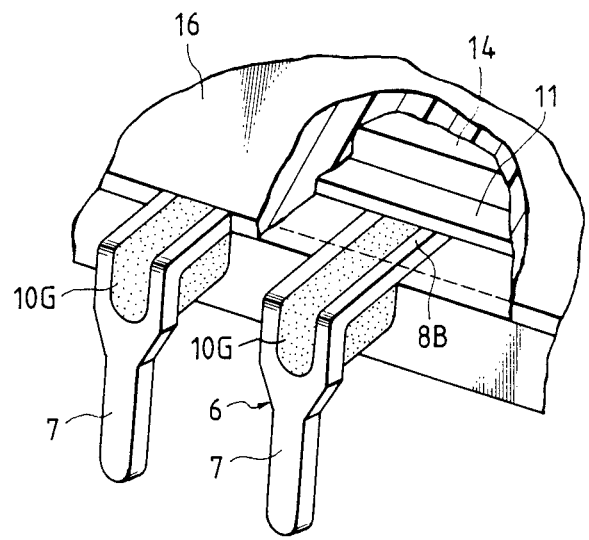
Figure 22:
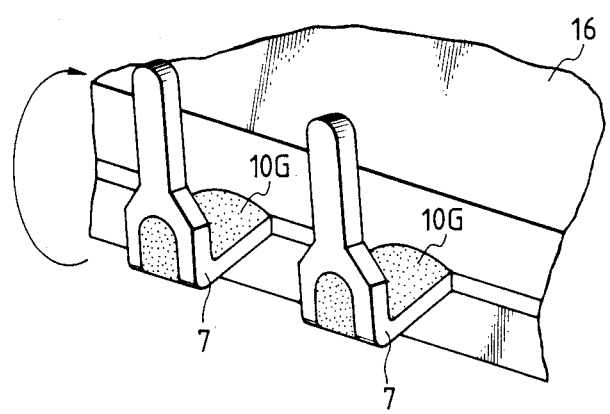

In a modification shown in FIGS. 21 and 22, a rib 10G made of the resin is formed on the outer lead 7 so as to be unitized with a through hole 10 exposed outside the package 16. The rib 10G is formed in a state in which the resin is packed in the through hole 10 and in which it is protruded into a space inside the crook part of the outer lead 7. The outer lead 7 formed with the through hole 10 is reinforced by the rib 10G.

[Embodiment 2]

Figure 23:
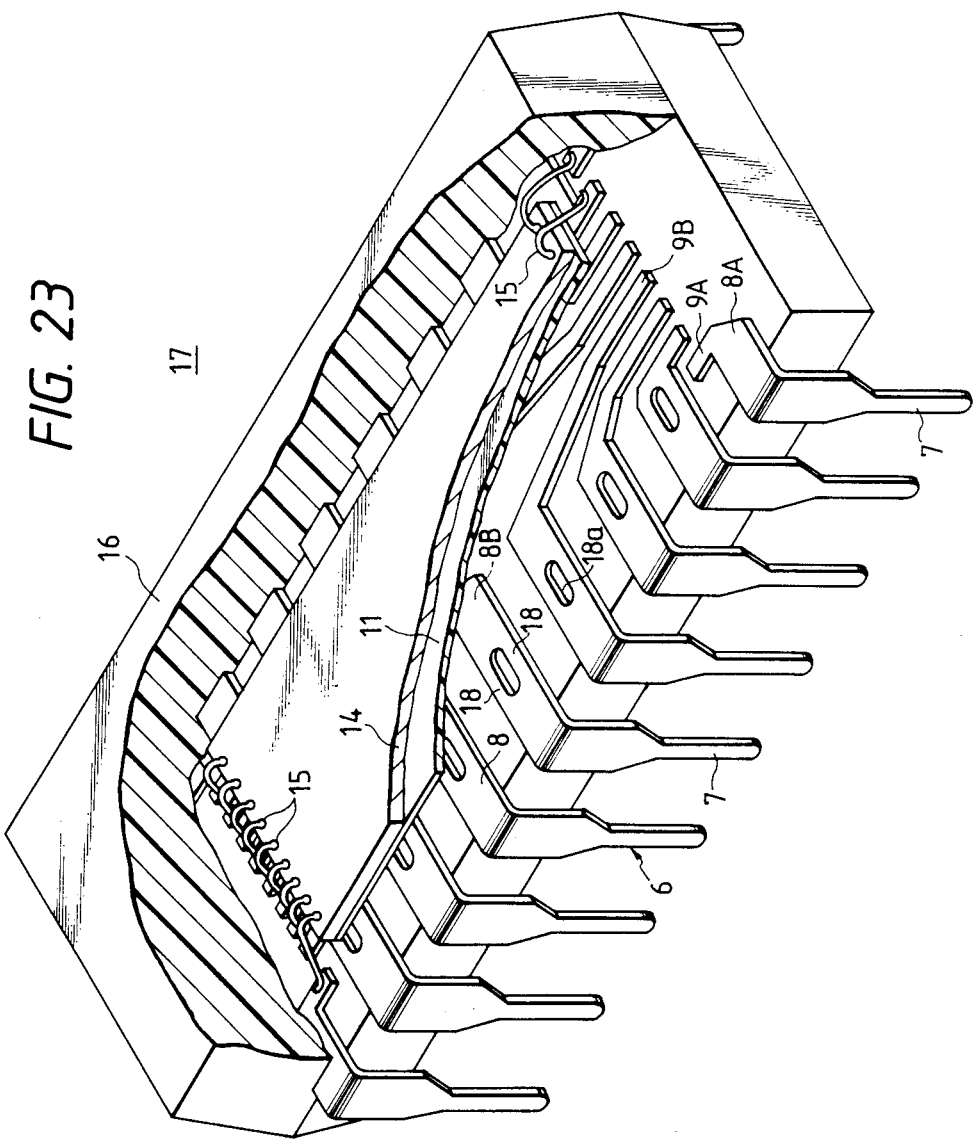
FIG. 23 is a perspective view, partly broken away, showing a DILIP-IC which in another embodiment of the present invention.

FIG. 23 is a perspective view, partly broken away, showing another embodiment of the present invention.

In Embodiment 2, each of central inner leads 8B laid just under a pellet 14 is such that the part of the lead opposing to the periphery of the lower surface of the semiconductor pellet 14 is divided in two in the widthwise direction of the lead, and that a resin portion is formed in the interspace 18a between the divided portions 18 and 18.

Figure 24:
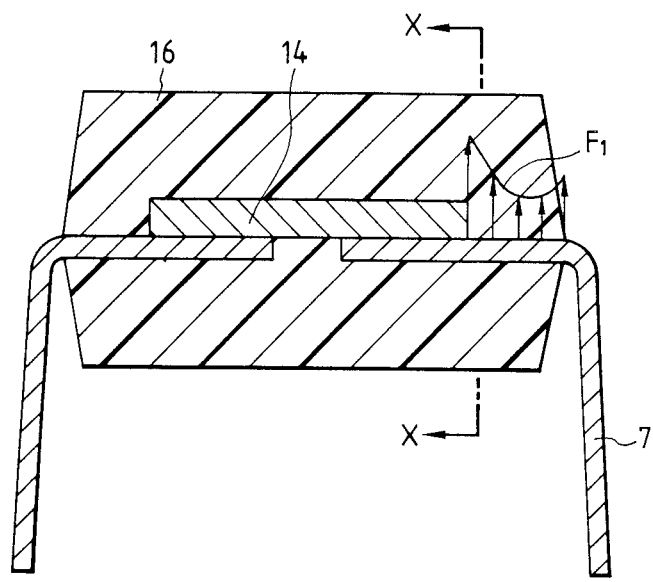
FIGS. 24, 25 and 26 are elucidatory views for explaining the functions of the embodiment.

According to Embodiment 2, that part of the central inner lead 8B which is subjected to a high thermal stress by the pellet 14 is divided into the plurality of narrow portions, and such parts are spaced from one another at intervals, so that any stress acting on a molding resin portion lying the leads is reduced. As a result, cracks can be prevented from occurring within such a resin-molding package 16. The function of this embodiment is elucidated as follows:

In a case where a pellet is installed on central inner leads through an insulating sheet, those parts or portions of the upper surfaces of the leads which are not overlaid with the semiconductor pellet undergo thermal stresses which are ascribable to the difference between the coefficients of linear expansion of the semiconductor pellet and a molding resin. Usually, the coefficient of linear expansion of the resin is greater than that of the semiconductor pellet. Therefore, tensile stresses as indicated at $F_1$ in FIG. 24 are exerted on the lead parts around the semiconductor pellet by cooling from a resin molding temperature, and the stresses become great particularly near the lower end part of the semiconductor pellet.

Figure 25:
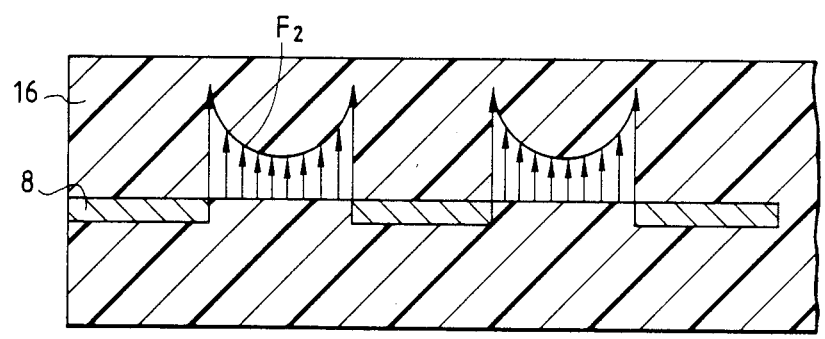
Figure 26:
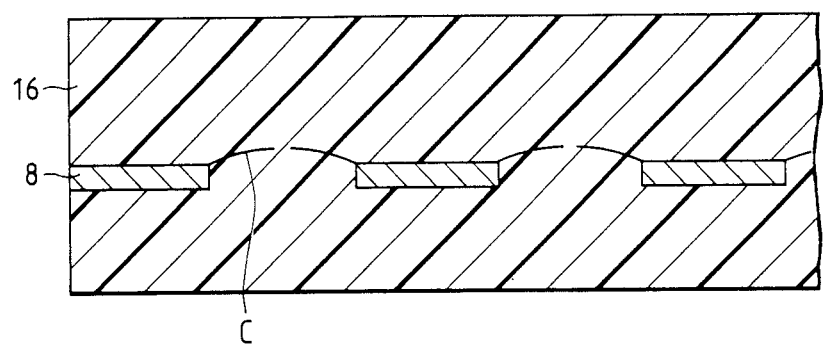

Since the bonded interface between each of the leads and the molding resin has only a very low bonding strength against the tensile stress, the molding resin portion easily peels off the upper surface of each of the leads surrounding the semiconductor pellet since this portion cannot withstand the tensile stress. There has characteristically been the problem wherein tensile stresses concentrate on the upper end parts of the leads between the adjacent leads as indicated at $F_2$ in FIG. 25, so that under a severe temperature environment such as during a temperature cycle test, resin cracks C occur between the leads as illustrated in FIG. 26. Here, FIGS. 25 and 26 are sectional views both taken along line X—X in FIG. 24.

The resin peels off the upper surfaces of the individual leads near the parts of the leads directly below the lower end part of the semiconductor pellet, to present a state in which fissured clearances are periodically arrayed in the field of the tensile stresses. The stress at a fissure end in the case of the periodical array of the fissures in the tensile stress field decreases more as the length of the fissure is smaller and as the ratio between the fissure length and the interval of the fissures is smaller. The fissure length in the model of the periodic fissures corresponds to the lead width of each individual lead sealed in a resin-molding package, and the fissure interval to the interval of the leads.

Accordingly, when the central inner leads directly below the lower end part of the semiconductor pellet are narrowed, the stresses of the resin packed between the adjacent inner leads, on the ends of the inner leads can be reduced. However, when the central inner leads are narrowed in conjunction with a prior-art structure which is otherwise left intact, the strength of the corresponding leads and the fixation strength of the leads owing to the resin become insufficient, so that the lead width cannot be satisfactorily decreased.

In contrast, according to Embodiment 2 in which each of the central inner leads is divided into the plurality of portions in the widthwise direction, the individual fissured clearances can be narrowed even when the resin peels off the upper surfaces of the leads. Therefore, the stresses on the lead ends can be reduced without lowering the strength of the leads or the fixation strength thereof.

A method of manufacturing the DILP-IC 17A shown in FIG. 23 is similar to the method of Embodiment 1. First, an insulating sheet 11 is bonded onto central inner leads 8B in such an arrangement that the edge of the former intersects orthogonally to the interspaces 18a between the divided portions 18, 18. Secondly, a pellet 14 is bonded onto the insulating sheet 11. Subsequently, pieces of wire 15 are bridgingly extended across the pads of the pellet 14 and the bonding portions 9 of the inner leads 8. Thereafter, a resin-molding package 16 is formed so as to seal the insulating sheet 11, pellet 14, inner leads 8 and wire pieces 15 in a resin.

According to Embodiment 2, each of the inner leads laid just under the pellet is divided in the widthwise direction, whereby the width of this lead can be suppressed small without considerably decreasing the whole cross-sectional area thereof. Therefore, the stresses between the leads can be reduced without lowering the strength of the leads or the fixation strength thereof owing to the resin. As a result, the resin cracks between the leads can be prevented from occurring.

Although, in the above, the other aspect of performance of the invention made by the inventors has been concretely described in conjunction with Embodiment 2, it is needless to say that the present invention is not restricted to this embodiment, but that it can be variously altered within a scope not departing from the purport thereof.

By way of example, the division of each central inner lead may be, not only by two, but also by three or more. However, when the interspace between two of the plurality of divided portions is narrow, the stress of a resin in this interspace heightens, and the propensity for a crack to occur becomes more liable. In order to prevent the cracks, it is desirable that the broadest possible interspace be provided between the two of the individual narrow divided portions, and the width of the interspace needs to be, at least, equal to the thickness of the lead.

The divided portions of the central inner lead are not restricted to the shape of parallel straight lines as shown in FIG. 23, but they may be crooked midway or have their widths changed midway. The length of the divided portions may well be nearly equal to or somewhat smaller than the width of the interspace.

At that part of the central inner lead 8B which passes directly below the lower end part of the pellet 14 on the side of the bonding portion 9B, the inner lead 8B can be narrowed at will irrespective of the fixation strength thereof, and hence, it need not be always divided in the widthwise direction as in Embodiment 2.

In addition, the division of the central inner leads need not be applied to all of them, but it may well be especially restricted to the leads associated with the location of severe stress conditions, for example, the leads lying directly below the central parts of the pair of longer sides of the pellet.

The way of drawing the leads out of the package is not restricted to two directions as illustrated in FIG. 23, but it may well be in one direction or in three or more directions. Besides, the leads may be drawn out, not only from the side surfaces of the package, but also from the upper surface or lower surface thereof.

Further, although a case of bending outer leads 7 downwards outside the package 16 is exemplified in FIG. 23, the leads outside the package may well be bent in any desired direction or shape or be left unbent.

Figure 27:
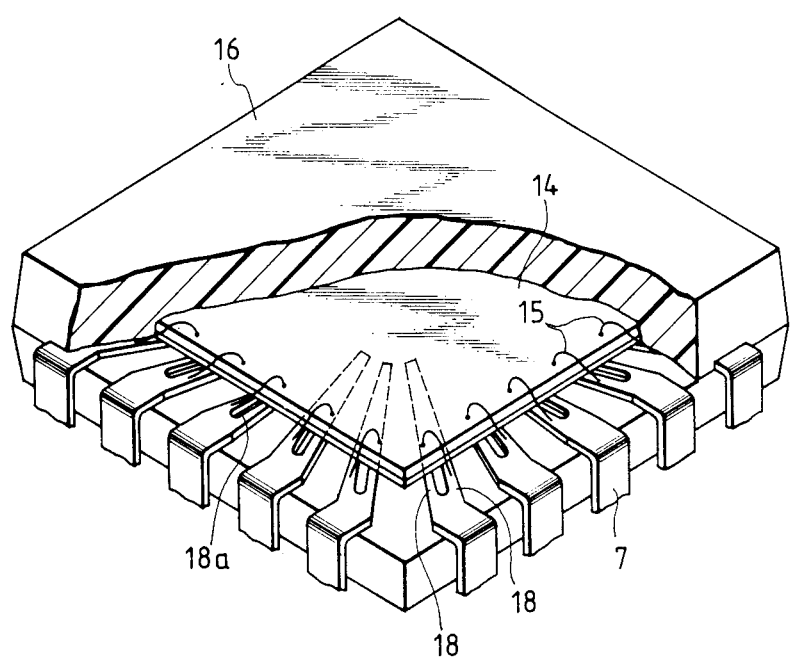
FIG. 27 is a perspective view, partly broken away, showing a modification of the embodiment in FIG. 23.

In a case where there is a dimensional allowance between the external shape of the resin-molding package and the end part of the pellet, or in a case where the leads are drawn out of the four surfaces of the package whose external shape is square in a top view, pieces of bonding wire 15 may well be connected to the drawn-out sides of the leads with respect to the pellet 14 as illustrated in FIG. 27. In this case, the inner lead 8 may have the wire 15 connected to either of the divided portions 18, 18 thereof as depicted in FIG. 27, to two or more of the divided portions thereof in multiple fashion, or to the undivided part thereof.

In both FIGS. 23 and 27, there is shown a structure in which tabs are abolished, whereupon the pellet is supported by only the leads. Embodiment 2, however, is also effective for a structure employing tabs jointly as disclosed in the official gazette of Japanese Patent Application Laid-open No. 218139/1986, as long as the structure is such that some of the leads are disposed just under the pellet. In addition, as described in the above official gazette, when the pellet is mounted on the leads, either the surface of the pellet formed with circuitry or the opposite surface thereof may be confronted to the leads.

The insulating layer between the pellet and the leads may be formed, not only by bonding the insulating sheet 11 in the shape of a film, but also by producing a film or depositing an electrically insulating coating on the upper surfaces of the leads or the lower surface of the pellet. It is also effective to use an insulating adhesive for the bonding operation.

Besides, the extent to which the insulation is applied need not be the entire area of the lower surface of the pellet, but it may well be restricted to only parts thereof where the pellet and the lead come into contact. Alternatively, the insulating sheet may well be locally inserted in such a manner that clearances are defined between the lower surface of the pellet and the upper surfaces of the leads 8.

Figure 28:
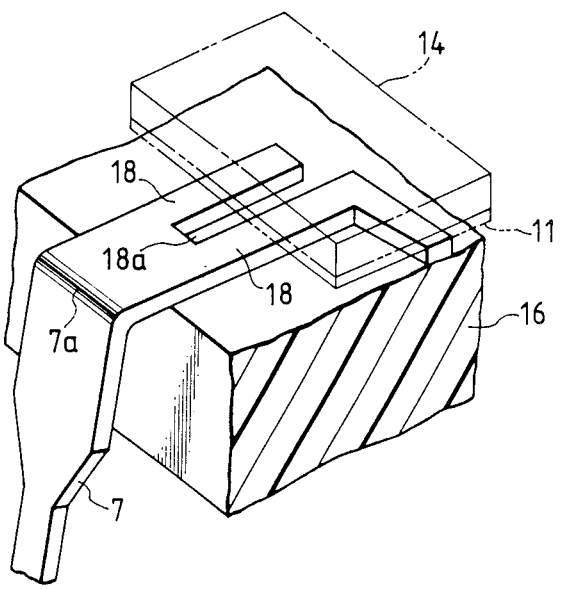
FIGS. 28, 29, 30, 31, 32, 33, 34 and 35 are perspective views of lead portions each respectively showing a further modification of the embodiment.

FIG. 28 is a perspective view showing a lead portion which is a modification of Embodiment 2, and parts above the lead are removed from the illustration. The divided lead 8 need not be in a form wherein the divided portions are connected on both of the sides of its divided portions 18 so as to form a closed loop, but it may well be extended under the pellet 14 in the divided state thereof as depicted in FIG. 28.

Figure 29:
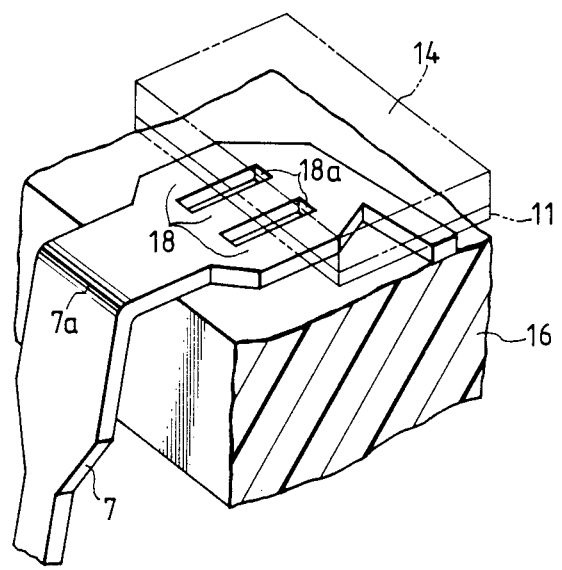

FIG. 29 is a perspective view showing a lead portion which is another modification. The total value of the widths of the individual divided portions 18 of the lead 8 need not always be smaller than the maximum width of the lead 8 outside the package 16. Even when the total width is greater than the lead width outside the package, a structure in which the individual divided portions 18 of the lead 8 are narrow and are mutually spaced at sufficient intervals as illustrated in FIG. 29 is effective to prevent cracks and can attain a high strength of the lead as well as a high fixation strength thereof.

Figure 30:
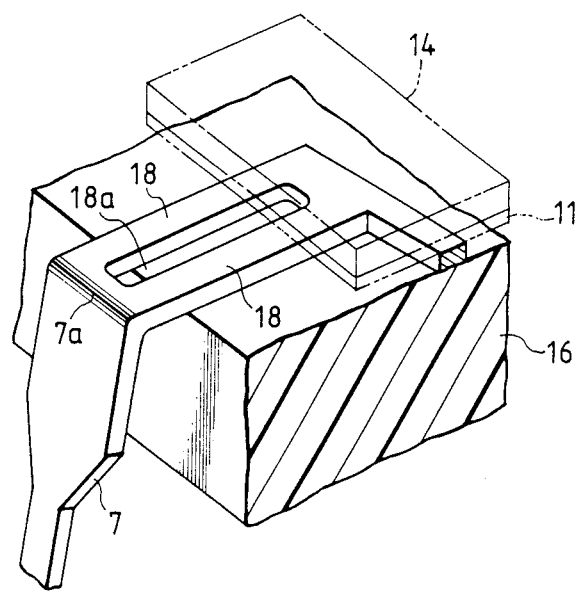

FIG. 30 is a perspective view showing a lead portion which is still another modification of Embodiment 2. As the size of the pellet 14 becomes enlarged, the end part of the pellet 14 comes nearer to the side end of the package 16. Then, thermal stresses generated by the pellet act intensely, not only on the vicinity of the lower end of the pellet, but also on the whole region between the side end of the package and the end of the pellet. Especially in the side end part of the package 16, the interfaces of the resin bonded to the leads are liable to be peeled by the step of cutting and forming the outer leads 7 after the resin molding operation, and high stress concentration is apt to occur in the resin between the adjacent leads as in the case of the lower end part of the pellet. According to a structure in which the interspace 18a between the divided portions 18, 18 of the inner lead directly below the lower end part of the pellet 14 is extended to the exterior of the package 16 as in the example of FIG. 30, the resin cracks between the adjacent leads can be prevented even in the case where the end part of the pellet 14 is close to the side end of the package 16.

Figure 31:
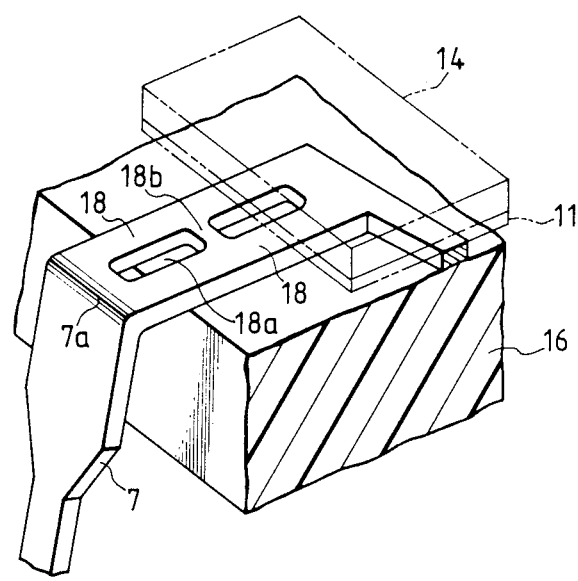

FIG. 31 is a perspective view showing a lead portion which is still another modification of Embodiment 2. As illustrated in FIG. 24, the stresses which act on the resin portion of the region between the lower end of the pellet and the side end of the package are high particularly at the parts corresponding to near the lower end of the pellet and near the side end of the package. Therefore, a portion 18b for coupling the divided portions 18, 18 to each other may well be provided at a position other than the parts of the high stresses so as to divide the lead 8 widthwise independently in a plurality of longitudinal places thereof. In this case, stress concentration which would develop because of the coupling portion 18b can be reduced by making this coupling portion 18b narrower, as in the case of the divided portion 18. It is accordingly desirable that the width of the coupling portion 18b be set nearly equal to or smaller than the width of the divided portion 18. However, the width of the coupling portion 18b here signifies an extent measured in the direction vertical to the widthwise direction of the lead.

Figure 32:
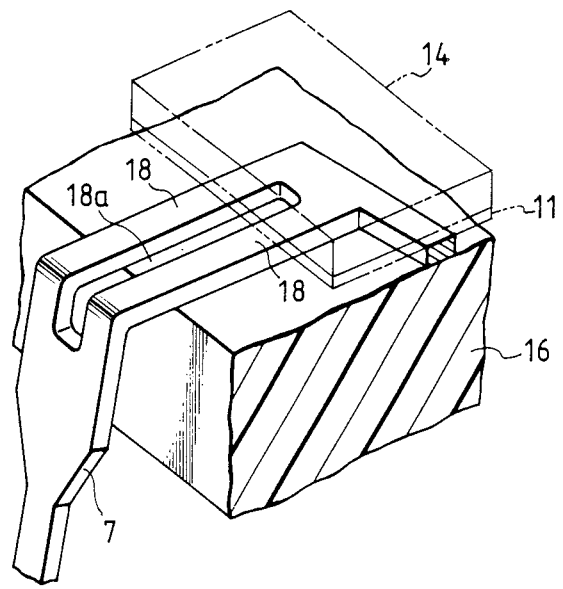

FIG. 32 is a perspective view showing a lead portion which is still another modification of Embodiment 2. When, with the crook or bent portion 7a of the outer lead 7 lying near the side end of the package 16, the width of the lead crook portion 7a being greater than the total width of the lead at the side end part of the package 16 as in the example of FIG. 30 or FIG. 31, a great force required for bending the wider portion in the lead forming operation acts on the narrower lead part corresponding to the side end of the package 16, and hence, the bonded interface between the lead and the resin portion and the resin portion around the lead are prone to damage. The damages near the bonded interface between the lead and the resin in the lead forming operation can be prevented, as illustrated in FIG. 32, by having the divided the lead extend outwardly beyond the bending portion 7a thereof.

Figure 33:
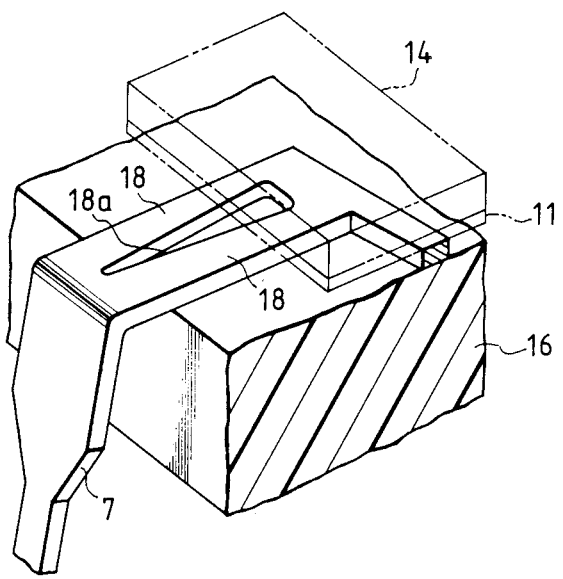
Figure 34:
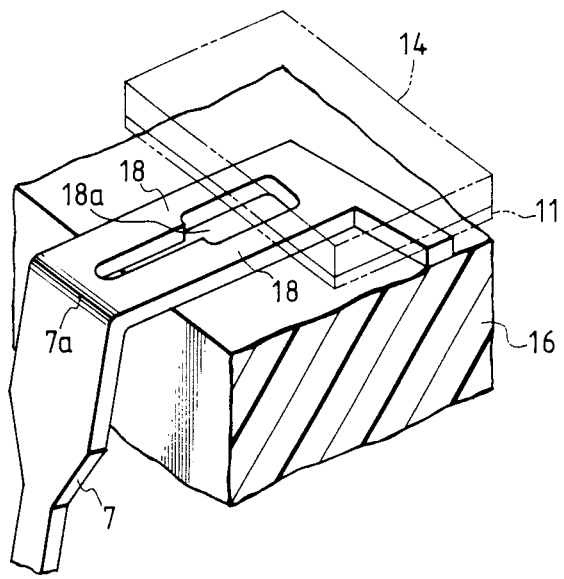

FIGS. 33 and 34 are perspective views each showing a lead portion which is still another modification of Embodiment 2. The stresses which the resin portion between the adjacent leads undergo are higher at the lower end part of the pellet 14 than at the side end part of the resin portion. In addition, it is desirable for ensuring the lead strength and the lead fixing strength that the lead width near the side end part, of the package 16 be set to as large a width as possible. Therefore, the width of the individual divided portions 18 of the lead 8 can be changed gradually as illustrated in the example of FIG. 33 or stepwise charged as illustrated in the example of FIG. 34, so as to make the lead width greater in the vicinity of the side end part of the package than in the lower end part of the pellet 14, whereby the lead strength and the lead fixing strength can be enhanced without adversely affecting the capability of preventing resin cracks. This method is effective, not only in the case where the lead division is extended to the exterior of the package 16, but also in the case where the lead division is extended to the vicinity of the side end of the package 16 inside this package.

Figure 35:
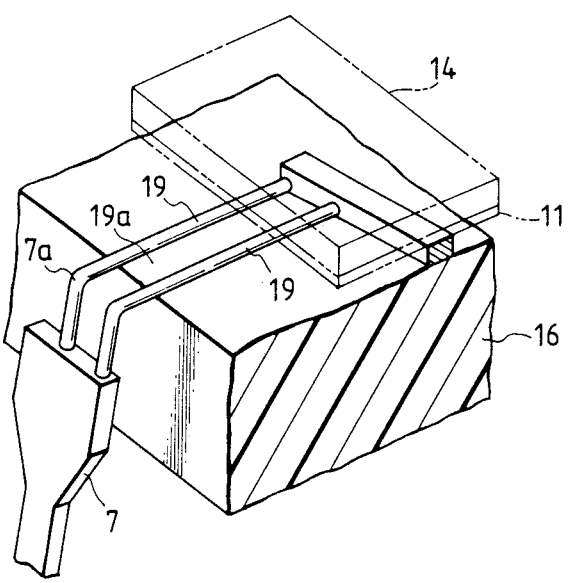

Further, the divided portions 19 of each lead may well be made of a plurality of wire rods as exemplified in FIG. 35. In short, it suffices that the molding resin lies inside the divided portions of the lead located inside the package, i.e. in the space between the divided portions within the molded package.

[Embodiment 3]

Figure 36:
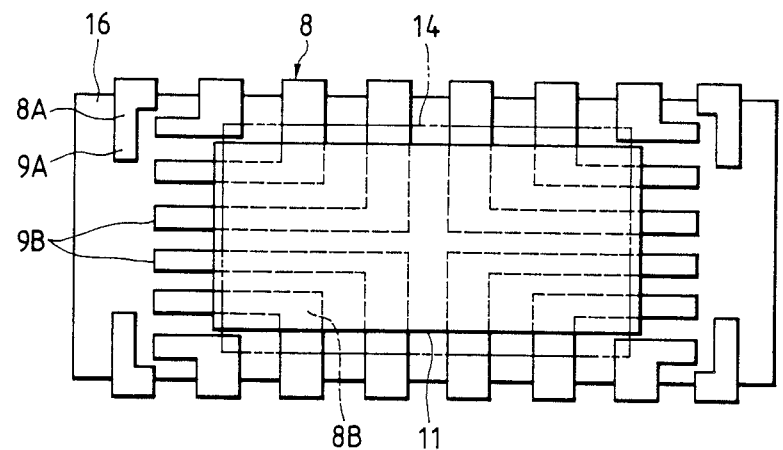
FIG. 36 is a sectional plan view showing still another embodiment of the present invention.
Figure 37:
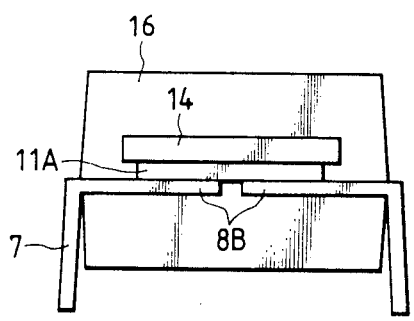
FIG. 37 is a sectional front view of the embodiment in FIG. 36.
Figure 38:
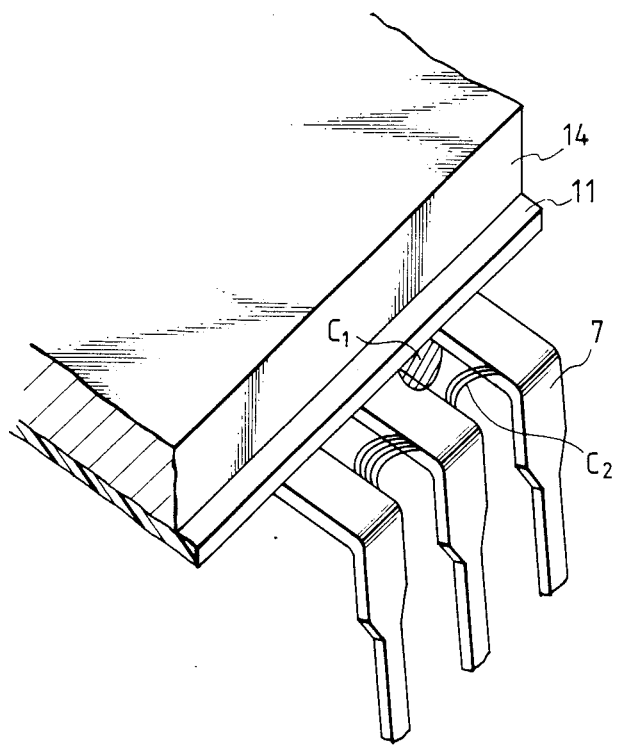
FIGS. 38, 39 and 40 are elucidatory views for explaining the functions of the embodiment in FIGS. 36 and 37.
Figure 39:
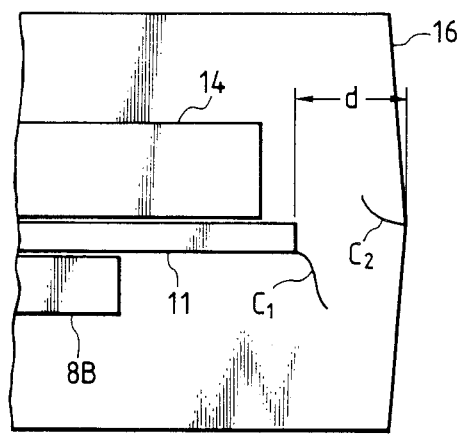
Figure 40:
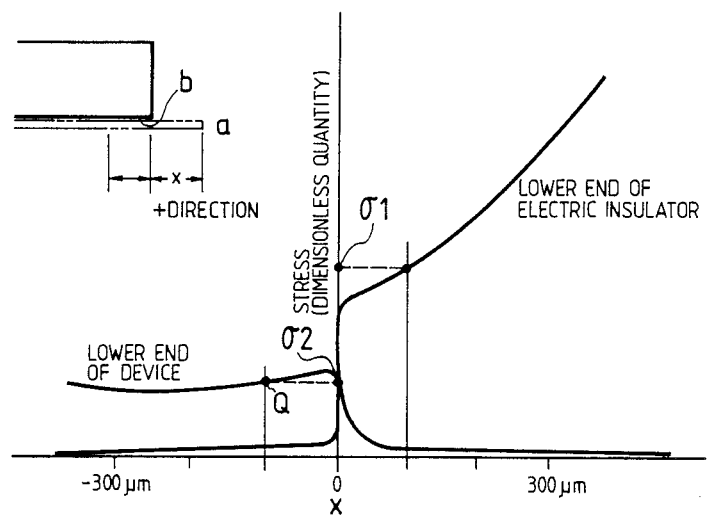

FIG. 36 is a sectional plan view showing yet another embodiment of the present invention, FIG. 37 is a sectional front view of the embodiment, and FIGS. 38-40 are elucidatory views for explaining the functions of the embodiment.

In Embodiment 3, an insulating sheet 11A which is interposed between a pellet 14 and central inner leads 8B laid just under the pellet is so formed that the dimension of the shorter lateral sides thereof are smaller than the dimensions of the shorter lateral sides of the pellet 14.

Meanwhile, in the prior-art structure of a resin-molding package wherein a pellet is fastened through an insulating sheet on inner leads laid centrally and wherein the size of the insulating sheet is larger than that of the pellet, when such a package is subjected to temperature cycles, cracks $C_1$ and $C_2$ sometimes occur inside the package as illustrated in FIGS. 38 and 39.

A cause for the occurrence of the crack $C_1$ spreading from the end part of the insulating sheet is that, since the insulating sheet is soft (filmy) and hardly bears stresses, thermal stresses ascribable to the difference between the coefficients of linear expansion of the material of the pellet and a resin as the material of the package concentrate in a resin portion lying in contact with the end part of the insulating sheet, whereupon the resin portion fatigues and breaks down.

On the other hand, the resin crack $C_2$ occurring between leads 8, 8 is ascribable to stress concentration in lead corner parts. One cause for the occurrence of this crack is that the stresses between the leads are increased by the crack $C_1$ which has arisen from the corner part of the insulating sheet. Accordingly, the crack $C_2$ of the lead corner part is a subsidiary crack as compared with the crack $C_1$ spreading from the corner part of the insulating sheet.

With the resin-molding package constructed as stated above, a thermal fatigue lifetime has at times been lowered to about 1/10 of that of a conventional package wherein a pellet is fastened to the tabs of a lead frame, so that the resin-molding package has not been always satisfactory in terms of reliability. It has therefore been requested to enhance the reliability against the temperature cycles, etc.

Embodiment 3 has solved the problem by making the dimension of the pair of shorter sides of the electric insulator smaller than that of the pair of shorter sides of the pellet.

Next, the functions of the embodiment will be described.

FIG. 40 is a graph showing the variations of stresses which arose in the molding resin portions of the resin-molding packages, in the case where the size of the insulating sheet was changed with that of the pellet held constant As understood from FIG. 40, in the prior-art structure wherein X>0 is set, an excess stress develops at a point a corresponding to the end part of the insulating sheet because of the stress concentration thereat may cause cracks to occur. Here, X denotes a value given by the following equation:

X=(size of insulating sheet—size of pellet)/2

As this value X becomes smaller, the stress of the point a of the insulating sheet somewhat decreases. The reason is that the distance d between the insulating sheet and the end part of the package increases as the value X becomes smaller. The stress, however, does not becomes lowered to the extent that no resin cracks occur.

As illustrated in FIG. 40, when the size of the insulating sheet becomes smaller than that of the pellet (the value X becomes minus), the stress concentration at the point a is reduced discontinuously and becomes almost null. On the other hand, a stress at a point b corresponding to the end part of the pellet increases at this time. However, if the resin portion does peel off the pellet, it is an indication that the developed stress has not become very high and such that it is suppressed to a level wherein cracks do not develop.

In such a case, accordingly, a resin which exhibits a good adhesion with the constituent material of the pellet may be selected by way of example. Comparisons will now be made between the case of the prior-art structure which is constructed at X= +100 μm and the case of Embodiment 3 which is constructed at X= −100 μm. As illustrated in FIG. 40, the developed stress becomes $\sigma_1$ in the case of the prior art and $\sigma_2$ in the case of Embodiment 3. The stress $\sigma_2$ in the embodiment lowers to about 40% of the stress $\sigma_1$ in the prior-art article.

Incidentally, even when the dimension of the shorter lateral side of the insulating sheet is rendered about 100 μm smaller than that of the shorter lateral side, of the pellet, no inconvenience arises in the manufacture thereof.

According to Embodiment 3, the dimension of the pair of shorter sides of the insulating sheet interposed between the pellet and the central inner leads is made smaller than the pair of shorter sides of the pellet, whereby the stress concentration of the resin portion to appear at the end part of the insulating sheet can be reduced substantially, so that resin cracks which would otherwise occur near the end part of the insulating sheet can be prevented.

Figure 41:
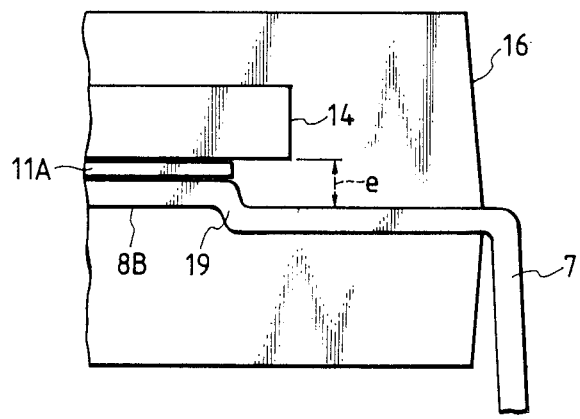
FIG. 41 is an enlarged partial vertical sectional view showing a modification of the embodiment in FIGS. 36 and 37.

FIG. 41 is an enlarged partial vertical-sectional view showing a modification of Embodiment 3. The central inner lead 8B is formed with a downward step 19 substantially at its position confronting the outer edge of the insulating sheet 11A, and the distance e between the lower surface of the pellet and the upper surface of the lead is increased by the step 19.

The effect of this example will be elucidated with reference to FIGS. 42 and 43. FIG. 42 is a cross-sectional view of a tabless package portion, and the resin stress distribution of a part Z—Z in the figure is illustrated in FIG. 43. The stress of the resin within the package 16 is the highest at the side surface the pellet 14, and it decreases abruptly in accordance with the distance orthogonally away from either of the main or principal surfaces of the pellet. For this reason, when the lead is provided with the stepped portion, the resin stress near the upper surface of the lead becomes lowered from $\sigma_3$ to $\sigma_4$ as depicted in FIG. 43, whereby the occurrence of the resin cracks from the lead can be prevented.

FIG. 44 is an enlarged partial sectional view showing another modification of Embodiment 3. In addition to the structure shown in FIG. 41, a groove is formed in the outer peripheral part of the rear surface of the pellet 14. Thus, the pellet and the resin are stably fixed, so that the stress concentration of the resin at the end part of the pellet as attributed to the peeling of the resin portion off the pellet can be prevented.

Effects which are attained by a typical aspect of performance of the present invention are briefly explained as follows:

In a semiconductor device comprising a resin-molding package in which a pellet is fastened to inner leads through an insulating layer, the bonding strength between the leads and a molding resin portion can be enhanced, stresses which arise between the leads can be reduced, and stress concentration in the molding resin portion which develops at the end part of the insulating layer can be reduced, so that the package can be prevented from cracking during occurrence of temperature cycles.

What is claimed is:

1. A semiconductor device comprising:
   a semiconductor pellet which has a principal surface and a rear surface;
   a plurality of external terminals which are formed on said principal surface of said semiconductor pellet;
   leads provided for said semiconductor pellet including ones which function as signal lines associated with said semiconductor pellet, said leads having inner lead portions and outer lead portions, respectively, and said pellet being disposed over said leads and being supported by some of said inner lead portions;
   means, disposed on said inner lead portions between said pellet and said inner lead portions, for electrically insulating said pellet from said some inner lead portions, said inner lead portions having a boundary line effected thereacross by an edge of an end side of said means for electrically insulating;
   means for electrically connecting respective external terminals and corresponding ones of said inner lead portions;
   a molding member which envelops said pellet, said inner lead portions and said means for electrically connecting; and
   wherein a through hole is provided in, at least, that part of each of said inner lead portions having said boundary line thereacross, each through hole being dimensioned such that it extends on at least the inner lead portion of the corresponding lead thereof in a direction both inwardly and outwardly with respect to said boundary line, the inwardly and outwardly going directions being defined, respectively, as directions toward and away from said semiconductor pellet at the rear surface thereof.

2. A semiconductor device according to claim 1, wherein each one of said outer lead portions is disposed outside said molding member and is bent at a part thereof, and wherein said through hole is extended outwardly to a position beyond said bent part of each corresponding outer lead portion.

3. A semiconductor device according to claim 1, wherein each one of said outer lead portions is disposed outside said molding member and is bent at a part thereof, and wherein said through hole is extended outwardly to a position short of reaching said bent part of each corresponding outer lead portion.

4. A semiconductor device according to claim 1, wherein said through hole is located within said molding member.

5. A semiconductor device comprising:
   a semiconductor pellet which has a principal surface and a rear surface and which is in the shape of a rectangle;
   a plurality of external terminals which are formed on said principal surface of said semiconductor pellet;
   leads provided for said semiconductor pellet including ones which function as signal lines associated with said semiconductor pellet, said leads having inner lead portions as well as outer lead portions, respectively, said inner lead portions having front end parts wherein bonding portions are formed, said semiconductor pellet being disposed over said leads and being supported by some of said inner lead portions, and said inner lead portions having front end parts which respectively protrude outwardly beyond an edge of a relatively short end side of said rectangular-shaped semiconductor pellet along the rear surface thereof;
   means, disposed on said inner lead portions between said pellet and said inner lead portions, for electrically insulating said pellet from said some inner lead portions, wherein said inner lead portions have a boundary line effected thereacross by an edge of another end side corresponding to said means for electrically insulating, and wherein said another end side is disposed near and along a lateral end side of said semiconductor pellet adjacent to said short end side;
   means for electrically connecting respective external terminals and corresponding ones of said inner lead portions at the respective bonding portions thereof;
   a molding member which envelops said pellet, said inner lead portions and said means for electrically connecting; and
   wherein a through hole is provided in, at least, that part of each of said inner lead portions having said boundary line thereacross, each through hole being dimensioned such that it extends on at least the inner lead portion of the corresponding lead in a direction both inwardly and outwardly with respect to said boundary line, the inwardly and outwardly going directions being defined, respectively, as directions toward and away from said semiconductor pellet at the rear surface thereof.

6. A semiconductor device according to claim 5, wherein each one of said outer lead portions is disposed outside said molding member and is bent at a part thereof, and wherein said through hole is extended outwardly to a position beyond said bent part of each corresponding outer lead portion.

7. A semiconductor device according to claim 5, wherein each one of said outer lead portions is disposed outside said molding member and is bent at a part thereof, and wherein said through hole is extended outwardly to a position short of reaching said bent part of each corresponding outer lead portion.

8. A semiconductor device according to claim 5, wherein said through hole is located within said molding member.

9. A semiconductor device comprising:
a semiconductor pellet which has a principal surface and a rear surface and which is in the shape of a rectangle;
a plurality of external terminals which are formed on said principal surface of said semiconductor pellet;
leads provided for said semiconductor pellet including ones which function as signal lines associated with said semiconductor pellet, said leads having inner lead portions as well as outer lead portions, respectively, said inner lead portions having front end parts wherein bonding portions are formed, said semiconductor pellet being disposed over said leads and being supported by some of said inner lead portions, and said inner lead portions having front end parts which respectively protrude outwardly from a short end side of said rectangular-shaped semiconductor pellet along the rear surface thereof;
means, disposed on said inner lead portions between said pellet and said inner lead portions, for electrically insulating said pellet from said some inner lead portions, wherein said inner lead portions have a boundary line effected thereacross by an edge of another end side corresponding to said means for electrically insulating, and wherein said another end side is disposed near and along a lateral end side of said semiconductor pellet adjacent to said short end side;
means for electrically connecting respective external terminals and corresponding ones of said inner lead portions at the respective bonding portions thereof;
a molding member which envelops said pellet, said inner lead portions and said means for electrically connecting; and
wherein each of said leads is comprised of inner lead portions and corresponding outer lead portions which form a branched lead arrangement including a plurality of branched portions in a widthwise direction of said leads in, at least, each of said inner lead portions, said branched portions being lengthwise dimensioned so as to extend both inwardly and outwardly with respect to said boundary line.

10. A semiconductor device according to claim 9, wherein each one of said outer lead portions is disposed outside said molding member and is bent at a part thereof, and wherein each of said leads is branched from, at least, said bent part of said outer lead portion to beneath said semiconductor pellet.

11. A semiconductor device according to claim 9, wherein the branched portions of said each lead are made of a plurality of wire rods.

12. A semiconductor device comprising:
a semiconductor pellet which has a principal surface and a rear surface and which is in the shape of a rectangle;
a plurality of external terminals which are formed on said principal surface of said semiconductor pellet;
leads for said semiconductor pellet including ones which function as signal lines associated with said semiconductor pellet, said leads having inner lead portions as well as outer lead portions, respectively, said inner lead portions having front end parts wherein bonding portions are formed, said semiconductor pellet being disposed over said leads and being supported by some of said inner lead portions, said inner lead portions having front end parts which respectively protrude outwardly from a short end side of said rectangular-shaped semiconductor pellet along the rear surface thereof;
a sheet of insulation, disposed on said inner lead portions between said semiconductor pellet and said inner lead portions, for electrically insulating said pellet from said some inner lead portions, wherein said inner lead portions have a boundary line effected thereacross by an edge of another end side corresponding to said sheet of insulating, and wherein said another end side is disposed near and along a lateral end side of said semiconductor pellet adjacent to said short end side;
means for electrically connecting respective external terminals and corresponding ones of said inner lead portions at the respective bonding portions thereof;
a molding member which envelops said pellet, said inner lead portions and said means for electrically connecting; and
wherein said sheet of insulation is in the shape of a rectangle dimensioned so as to have a short lateral end side which is set to be smaller than that of the short lateral end side of said rectangular-shaped semiconductor pellet.

13. A semiconductor device according to claim 12, wherein said each inner lead portion is formed with a downward step under said pellet and at an aligned position with said another end side of said sheet of insulation which corresponds to a laterally adjacent end side of said short end side thereof.

14. A semiconductor device according to claim 13, wherein a groove is formed in a portion of that outer peripheral part of the rear surface of said semiconductor pellet which is between said lateral end side of said semiconductor pellet and said another end side of said sheet of insulation, said outer peripheral part of the rear surface of said semiconductor pellet corresponding to the part of the rear surface not insulated by said sheet of insulation.

15. A semiconductor device according to claim 2, wherein each one of said outer lead portions is bent in one of downwardly and upwardly extending directions with respect to a horizontal forming surface plane corresponding to the plane effected by said leads.

16. A semiconductor device according to claim 3, wherein each one of said outer lead portions is bent in one of downwardly and upwardly extending directions with respect to a horizontal forming surface plane corresponding to the plane effected by said leads.

17. A semiconductor device according to claim 6, wherein each one of said outer lead portions is bent in one of downwardly and upwardly extending directions with respect to a horizontal forming surface plane corresponding to the plane effected by said leads.

18. A semiconductor device according to claim 7, wherein each one of said outer lead portions is bent in one of downwardly and upwardly extending directions with respect to a horizontal forming surface plane corresponding to the plane effected by said leads.

19. A semiconductor device according to claim 10, wherein each one of said outer lead portions is bent in one of downwardly and upwardly extending directions with respect to a horizontal forming surface plane corresponding to the plane effected by said leads.

20. A semiconductor device according to claim 10, wherein the branched portions of said each lead are made of a plurality of wire rods.

21. A semiconductor device according to claim 20, wherein each one of said outer lead portions is bent in one of downwardly and upwardly extending directions with respect to a horizontal forming surface plane corresponding to the plane effected by said leads.

22. A semiconductor device according to claim 1, wherein said semiconductor pellet is of an elongated rectangular shape having a pair of long end sides and a pair of relatively short end sides,
said elongated semiconductor pellet being insulatedly leads of the inner lead portions thereof which provide support for said semiconductor pellet.

23. A semiconductor device according to claim 22, wherein the inner lead portion arrangement is such that the front ends thereof include bonding portions and extend outwardly beyond the corresponding edges of the short end sides and are aligned for electrical connection via said metal wire pieces with a corresponding external terminal near the short end side edges of the semiconductor pellet, and wherein the respective back ends of said inner lead portions extend outwardly from the long end side edges of the semiconductor pellet toward a corresponding end side of said molding member envelope, the outer lead portions thereof corresponding to the lead portions outside of said molding member envelope are contiguous with the inner lead portions respectively associated therewith.

24. A semiconductor device according to claim 23, wherein said outer lead portions are bent in one of downwardly and upwardly extending directions with respect to a horizontal forming surface plane corresponding to the plane effected by said leads.

25. A semiconductor device according to claim 24, wherein said through hole is extended outwardly to a position beyond the bent part of each corresponding outer lead portion.

26. A semiconductor device according to claim 24, wherein said through hole is extended outwardly to a position short of reaching the bent part of each corresponding outer lead portion.

27. A semiconductor device according to claim 26, wherein each through hole formed on a corresponding lead extends outwardly to a position which is within said molding member envelope.

28. A semiconductor device according to claim 24, wherein said through holes are of an elongated shape.

29. A semiconductor device according to claim 24, wherein said through hole is of an elongated shape such that it becomes narrower outwardly away from the edge of the corresponding long end side of said semiconductor pellet.

30. A semiconductor device according to claim 1, wherein said through holes are of an elongated shape.

31. A semiconductor device according to claim 1, wherein said through hole is of an elongated shape such that it becomes narrower outwardly away from the edge of the corresponding long end side of said semiconductor pellet.

32. A semiconductor device comprising:
A semiconductor pellet which has a principal surface and a rear surface;
a plurality of external terminals which are formed on said principal surface of said semiconductor pellet;
leads provided for said semiconductor pellet including ones which function as signal lines associated with said semiconductor pellet, said leads having inner lead portions and outer lead portions, respectively, and said pellet being supported by some of said inner lead portions;
means for electrically insulating said pellet and said some inner lead portions, said inner lead portions having a boundary line effected thereacross by an edge of an end side of said means for electrically insulating;
means for electrically connecting respective external terminals and corresponding ones of said inner lead portions;
a molding member which envelops said pellet, said inner lead portions and said means for electrically connecting; and
wherein a through hole is provided in, at least, that part of each of said inner load portions having said boundary line there across, each through hole being dimensioned such that it extends on at least the inner lead portion of the corresponding lead thereof in a direction both inwardly and outwardly with respect to said boundary line.

33. A semiconductor device according to claim 32, wherein each one of said outer lead portions is disposed outside said molding member and is bent at a part thereof, and wherein said through hole is extended outwardly to a position beyond said bent part of each corresponding outer lead portion.

34. A semiconductor device according to claim 33, wherein each one of said outer lead portions is bent in one of downwardly and upwardly extending directions with respect to a horizontal forming surface plane corresponding to the plane effected by said leads.

35. A semiconductor device according to claim 32, wherein each one of said outer lead portions is disposed outside said molding member and is bent at a part thereof, and wherein said through hole is extended outwardly to a position short of reaching said bent part of each corresponding outer lead portion.

36. A semiconductor device according to claim 35, wherein each one of said outer lead portions is bent in one of downwardly and upwardly extending directions with respect to a horizontal forming surface plane corresponding to the plane effected by said leads.

37. A semiconductor device according to claim 32, wherein said through hole is located within said molding member.

38. A semiconductor device according to claim 32, wherein said semiconductor pellet is of an elongated rectangular shape having a pair of long end sides and a pair of relatively short end sides, said elongated semiconductor pellet being insulatedly disposed via its principle surface thereof centrally on said leads and over a symmetrically dispersed laid-out arrangement of the inner lead portions thereof which provide support for said semiconductor pellet.

39. A semiconductor device according to claim 38, wherein the inner lead portion arrangement is such that the front ends thereof includes bonding portions and extend in the vicinity of the corresponding edges of the short end sides and are aligned for electrical connection via said means for electrically connecting with a corresponding external terminal near the short end side edges of the semiconductor pellet, and wherein the respective back ends of said inner lead portions extend outwardly from the long end side edges of the semiconductor pellet toward a corresponding end side of said molding member envelope, the outer lead portions thereof corresponding to the lead portions outside of said molding member envelope are contiguous with the inner lead portions respectively associated therewith.

40. A semiconductor device according to claim 39, wherein said outer lead portions are bent in one of downwardly and upwardly extending directions with respect to a horizontal forming surface plane corresponding to the plane effected by said leads.

41. A semiconductor device according to claim 40, wherein said through hole is extended outwardly to a position beyond the bent part of each corresponding outer lead portion.

42. A semiconductor device according to claim 40, wherein said through hole is extended outwardly to a position short of reaching the bent part of each corresponding outer lead portion.

43. A semiconductor device according to claim 42, wherein each through hole formed on a corresponding lead extends outwardly to a position which is within said molding member envelope.

44. A semiconductor device according to claim 40, wherein said through holes are of an elongated shape.

45. A semiconductor device according to claim 40, wherein said through hole is of an elongated shape such that it becomes narrower outwardly away from the edge of the corresponding long end side of said semiconductor pellet.

46. A semiconductor device according to claim 32, wherein said through holes are of an elongated shape.

47. A semiconductor device according to claim 32, wherein said through hole is of an elongated shape such that it becomes narrower outwardly away from the edge of the corresponding long end side of said semiconductor pellet.

48. A semiconductor device comprising:
a semiconductor pellet which has a principal surface and a rear surface and which is in the shape of a rectangle;
a plurality of external terminals which are formed on said principal surface of said semiconductor pellet;
leads provided for said semiconductor pellet including ones which function as signal lines associated with said semiconductor pellet, said leads having inner lead portions as well as outer lead portions, respectively, said inner lead portions having front end parts wherein bonding portions are formed, said semiconductor pellet being supported by some of said inner lead portions, and said inner lead portions having front end parts which respectively extend to the external terminals which are arranged in the vicinity of an edge of a relatively short end side of said rectangular shaped semiconductor pellet;
means for electrically insulating said pellet and said some inner lead portions, wherein said inner lead portions have a boundary line effected thereacross by an outer edge of an end side of said means for electrically insulating, and wherein said end side corresponds to a lateral side adjacent to said short end side;
means for electrically connecting respective external terminals and corresponding ones of said inner lead portions at the respective bonding portions thereof;
a molding member which envelopes said pellet, said inner lead portions and said means for electrically connecting; and
wherein a through hole is provided in, at least, that part of each of said inner lead portions having said boundary line thereacross, each through hole being dimensioned such that it extends on at least the inner lead portion of the corresponding lead in a direction both inwardly and outwardly with respect to said boundary line.

49. A semiconductor device according to claim 48, wherein each one of said outer lead portions is disposed outside said molding member and is bent at a part thereof, and wherein said through hole is extended outwardly to a position beyond said bent part of each corresponding outer lead portion.

50. A semiconductor device according to claim 49, wherein each one of said outer lead portions is bent in one of downwardly and upwardly extending directions with respect to a horizontal forming surface plane corresponding to the plane effected by said leads.

51. A semiconductor device according to claim 48, wherein each one of said outer lead portions is disposed outside said molding member and is bent at a part thereof, and wherein said through hole is extended outwardly to a position short of reaching said bent part of each corresponding outer lead portion.

52. A semiconductor device according to claim 51, wherein each one of said outer lead portions is bent in one of downwardly and upwardly extending directions with respect to a horizontal forming surface plane corresponding to the plane effected by said leads.

53. A semiconductor device according to claim 48, wherein said through hole is located within said molding member.

54. A semiconductor device comprising:
a semiconductor pellet which has a principal surface and a rear surface and which is in the shape of a rectangle;
a plurality of external terminals which are formed on said principal surface of said semiconductor pellet;
leads provided for said semiconductor pellet including ones associated with said semiconductor pellet, said leads having inner lead portions as well as outer lead portions, respectively, said inner lead portions having front end parts wherein bonding portions are formed, said semiconductor pellet being supported by some of said inner lead portions, and said inner lead portions having front end parts which respectively extend to a short end side of said rectangular-shaped semiconductor pellet;

means for electrically insulating said pellet and said some inner lead portions, wherein said inner lead portions have a boundary line effected thereacross by an outer edge of an end side of said means for electrically insulating, and wherein said end side corresponds to a lateral side adjacent to said short end side, means for electrically connecting respective external terminals and corresponding one of said inner lead portions at the respective bonding portions thereof;

a molding member which envelops said pellet, said inner lead portions and said means for electrically connecting; and wherein each of said leads is comprised of inner lead portions and corresponding outer lead portions which form a branched lead arrangement including a plurality of branched portions in a widthwise direction of said leads in, at least, each of said inner lead portions, said branched portions being lengthwise dimensioned so as to extend both inwardly and outwardly with respect to said boundary line.

55. A semiconductor device according to claim 54, wherein each one of said outer lead portions is disposed outside said molding member and is bent at a part thereof, and wherein each of said leads is branched from, at least, said bent part of said outer lead portion to beneath said semiconductor pellet.

56. A semiconductor device according to claim 55, wherein each one of said outer lead portions is bent in one of downwardly and upwardly extending directions with respect to a horizontal forming surface plane corresponding to the plane effected by said leads.

57. A semiconductor device according to claim 55, wherein the branched portions of said each lead are made of a plurality of wire rods.

58. A semiconductor device according to claim 57, wherein each one of said outer lead portions is bent in one of downwardly and upwardly extending directions with respect to a horizontal forming surface plane corresponding to the plane effected by said leads.

59. A semiconductor device according to claim 54, wherein the branched portions of said lead are made of a plurality of wire rods.

60. A semiconductor device comprising:

a semiconductor pellet which has a principal surface and a rear surface and which is in the shape of a rectangle;

a plurality of external terminals which are formed on said principal surface of said semiconductor pellet;

leads for said semiconductor pellet including ones which function as signal lines associated with said semiconductor pellet, said leads having inner lead portions as well as outer lead portions, respectively, said inner lead portions having front end parts wherein bonding portions are formed, said semiconductor pellet being supported by some of said inner lead portions, said inner lead portions having front end parts which respectively extend to a short end side of said rectangular-shaped semiconductor pellet;

a sheet which electrically insulated said pellet and said some inner lead portions, wherein said inner lead portions have a boundary line effected thereacross by an outer edge of an end side of said sheet, and wherein said end side thereof corresponds to a lateral end side adjacent to said short end side, means for electrically connecting respective external terminals and corresponding ones of said inner lead portions at the respective bonding portions thereof;

a molding member which envelops said pellet, said inner lead portions and said means for electrically connecting; and wherein said sheet is in the shape of a rectangle dimensioned so as to have a short lateral end side which is set to be smaller than that of the short lateral end side of said rectangular-shaped semiconductor pellet.

* * * * *